(12) United States Patent
Krapp et al.

(10) Patent No.: US 6,889,297 B2
(45) Date of Patent: May 3, 2005

(54) METHODS AND SYSTEMS FOR ELIMINATING DATA REDUNDANCIES

(75) Inventors: Oliver Krapp, Hamburg (DE); Thorsten Laux, Hamburg (DE); Joerg Heilig, Hamburg (DE)

(73) Assignee: Sun Microsystems, Inc., Santa Clara, CA (US)

( * ) Notice: Subject to any disclaimer, the term of this patent is extended or adjusted under 35 U.S.C. 154(b) by 206 days.

(21) Appl. No.: 10/104,317

(22) Filed: Mar. 22, 2002

(65) Prior Publication Data

US 2002/0169934 A1 Nov. 14, 2002

(51) Int. Cl.[7] .............................................. G06F 12/00
(52) U.S. Cl. .......................... 711/159; 714/8; 707/204
(58) Field of Search ......................... 711/159; 714/8; 707/204

(56) References Cited

U.S. PATENT DOCUMENTS

| | | | |
|---|---|---|---|
| 5,649,196 A | 7/1997 | Woodhill et al. | 395/620 |
| 5,710,919 A | 1/1998 | Rail | 395/612 |
| 5,742,797 A | 4/1998 | Celi, Jr. et al. | 395/507 |
| 5,907,672 A * | 5/1999 | Matze et al. | 714/8 |
| 5,933,842 A | 8/1999 | Ross | 707/514 |
| 6,374,266 B1 * | 4/2002 | Shnelvar | 707/204 |

FOREIGN PATENT DOCUMENTS

| | | |
|---|---|---|
| EP | 0590645 | 4/1994 |
| EP | 0994425 | 4/2000 |
| WO | WO 00/45516 | 8/2000 |

OTHER PUBLICATIONS

Daniel Barbard et al., *Exploiting Symmetries For Low–Cost Comparison Of File Copies*, Proc. of the 8th International Conf. on Distributed Computing Systems, 1998 (Jun. 13, 1988), pp. 471–479.

* cited by examiner

*Primary Examiner*—Mano Padmanabhan
*Assistant Examiner*—Thang Ho
(74) *Attorney, Agent, or Firm*—Sonnenschein Nath & Rosenthal LLP

(57) ABSTRACT

Methods, systems, and articles of manufacture consistent with the present invention eliminate data redundancies. A first data block identifier is obtained for a first data block, the first data block identifier being calculated based on data of the first data block. It is determined whether a second data block identifier matching the first data block identifier exists, the second data block identifier being calculated based on data of a second data block. When it is determined that the second data block identifier matching the first data block identifier exists, the first data block identifier is indicated as being is redundant.

46 Claims, 12 Drawing Sheets

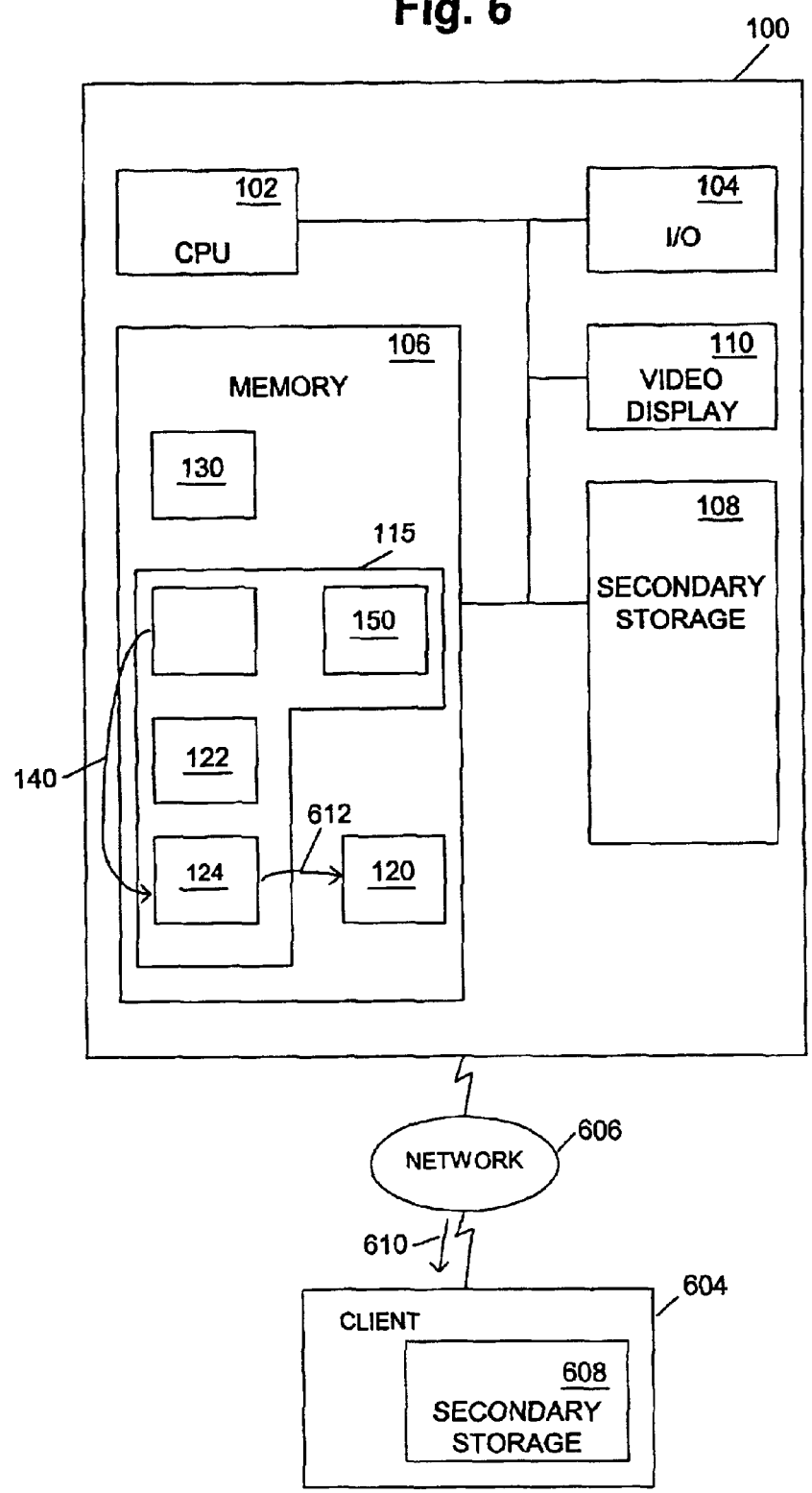

METHODS AND SYSTEMS FOR ELIMINATING DATA REDUNDANCIES

CROSS-REFERENCE TO RELATED APPLICATIONS

This Application claims priority to the filing date of the following foreign patent application, which is incorporated herein by reference:

European Patent Application No. 01106459.9, entitled "METHOD AND SYSTEM FOR ELIMINATING DATA REDUNDANCIES" filed Mar. 23, 2001.

FIELD OF THE INVENTION

The present invention relates to computer memory allocation, and in particular, the invention relates to eliminating data redundancies in a memory.

BACKGROUND OF THE INVENTION

Computers and networks of computers provide services in a growing number of fields, including office applications such as text processing and spread sheet applications, e-mail applications, virtual shopping services, home banking applications, personal service applications, and applications in connection with an operating system.

These applications generally provide services to a user operating a data processing device, and to do so, these applications may be either executed at the user's data processing device or executed at a remote data processing device or server, for example, under control of the user operating a client data processing device.

A data processing device typically includes a central data processing unit for executing coded instructions of an application program. Further, a data processing device typically includes a random access memory (RAM) for short-term storage and a long term memory such as a hard disk or a compact disc. During execution of coded instructions of an application program, the central data processing unit typically allocates storage space in the long term memory or temporary storage space in the RAM, for example, for intermediately storing items, such as, data blocks or partitions of the application program and data to be operated on by the application program.

An application program may comprise a single program executed on a single data processing device, where the data processing device executes coded instructions of the application program. As application programs increase in complexity, however, it may be advantageous to divide the application programs into a plurality of application modules, where the application modules cooperate to provide a service to a user. For example, an application program relating to an office application, such as text processing, could include a plurality of application modules covering the functions of retrieving a document, displaying a document, and receiving and processing editing commands.

If the application program comprises a plurality of application modules, each of the application modules may be authorized to allocate data blocks in memory in the process of providing a service to the user.

Since applications and application modules may execute similar functions and access similar data to be operated on, different applications and application modules allocate space in commonly accessible memories, such as in a hard disc or RAM, for the same data or data blocks. The data or data blocks include, for example, data to be operated on or computational results.

Further, particularly in computer networks, a large number of users may access the computational resources of a server, for example, through client data processing units connected to the server via a communication link. A situation may occur wherein a plurality of users launch the same application program for execution at the server unit. In this case, the server unit will execute similar processes for each of the plurality of users and also allocate memory space, for example in a RAM or on storage means such as a hard disk or a writeable compact disc, for identical data or data blocks.

Consequently, in the above case, the server may allocate memory space a plurality of times for the same data block.

In a typical approach to address this problem, if the data blocks for example are constituted by data files having names, then multiple storage of data files having the same name, e.g., on a hard disk of a server computer, is avoided by determining which data files have the same name and by eliminating all but one data file having the same name.

This approach is insufficient, however, because only entire data files may be treated, the names of the data files may not be unique, and full knowledge of all allocated data blocks may not be available.

Based on the above-described problems of data processing systems, it is therefore desirable to improve them.

SUMMARY OF THE INVENTION

Methods, systems, and articles of manufacture consistent with the present invention provide for eliminating data redundancies in a data processing system. When a data block is received, a data block identifier is obtained for the received data block. The data block identifier is calculated, for example, based on the data content of the data block. Then, it is determined whether another data block identifier that matches the obtained data block identifier already exists. If matching data block identifier already exists, then the received data block is redundant to an already existing data block. Therefore, the received data block will be identified as being redundant. When the received data block is identified, it can for example be deleted or be replaced with a reference to the already existing data block. This eliminates the data redundancy of storing multiple copies of the same data block, which saves memory space.

For example, if two processes transmit identical data blocks at different times, when the latter data block is received, its data block identifier is obtained and compared to known data block identifiers. If it is determine that the data block identifier already exists, then it is known that the data block has already been received. Accordingly, the latter data block can, for example, be deleted.

In accordance with methods consistent with the present invention, a method for eliminating data redundancies in a data processing system is provided. The method comprises the steps of: obtaining a first data block identifier for a first data block, the first data block identifier being calculated based on data of the first data block; determining whether a second data block identifier matching the first data block identifier exists, the second data block identifier being calculated based on data of a second data block; and when it is determined that the second data block identifier matching the first data block identifier exists, indicating that the first data block identifier is redundant.

In accordance with methods consistent with the present invention, a method in a data processing system having data blocks with associated identifiers is provided. The method comprises the steps of: receiving a request for a reference to a memory location that stores data, the request comprising the data; creating a new identifier that is based on the data; determining whether the new identifier is equivalent to one of the associated identifiers; and when it is determined that the new identifier is equivalent to one of the associated identifiers, returning a reference to the data block that is associated with the one associated identifier.

In accordance with methods consistent with the present invention, a method for avoiding data redundancies in a data processing system is provided. The method comprises the steps of: obtaining a first data block identifier for a first data block, the first data block identifier being calculated based on data of the first data block; generating a memory allocation request for the first data block; transmitting the memory allocation request to a redundancy handler, the memory allocation request instructing the redundancy handler to determine whether a second data block identifier matching the first data block identifier exists, wherein the second data block identifier is calculated based on data of a second data block; and receiving an allocation response indicating whether the second data block identifier of the second data block exists.

In accordance with methods consistent with the present invention, a method for eliminating data redundancies in a data processing system is provided. The method comprises the steps of: receiving a first data block; calculating a first data block identifier based on data of the first data block; determining whether a second data block identifier matching the first data block identifier exists in a list of other data block identifiers, the second data block identifier being calculated based on data of a second data block; when it is determined that the second data block identifier matching the first data block identifier exists, deleting the first data block; and when it is determined that the second data block identifier matching the first data block identifier does not exist, adding the first data block identifier to the list.

In accordance with articles of manufacture consistent with the present invention, a computer-readable medium containing instructions that cause a data processing system to perform a method is provided. The method comprises the steps of: obtaining a first data block identifier for a first data block, the first data block identifier being calculated based on data of the first data block; determining whether a second data block identifier matching the first data block identifier exists, the second data block identifier being calculated based on data of a second data block; and when it is determined that the second data block identifier matching the first data block identifier exists, indicating that the first data block identifier is redundant.

In accordance with articles of manufacture consistent with the present invention, a computer-readable medium containing instructions that cause a data processing system having blocks associated with identifiers to perform a method is provided. The method comprises the steps of: receiving a request for a reference to a memory location that stores data, the request comprising the data; creating a new identifier that is based on the data; determining whether the new identifier is equivalent to one of the associated identifiers; and when it is determined that the new identifier is equivalent to one of the associated identifiers, returning a reference to the data block that is associated with the one associated identifier.

In accordance with articles of manufacture consistent with the present invention, a computer-readable medium containing instructions that cause a data processing system to perform a method is provided. The method comprises the steps of: obtaining a first data block identifier for a first data block, the first data block identifier being calculated based on data of the first data block; generating a memory allocation request for the first data block; transmitting the memory allocation request to a redundancy handler, the memory allocation request instructing the redundancy handler to determine whether a second data block identifier matching the first data block identifier exists, wherein the second data block identifier is calculated based on data of a second data block; and receiving an allocation response indicating whether the second data block identifier of the second data block exists.

In accordance with articles of manufacture consistent with the present invention, a computer-readable medium containing instructions that cause a data processing system to perform a method is provided. The method comprises the steps of: receiving a first data block; calculating a first data block identifier based on data of the first data block; determining whether a second data block identifier matching the first data block identifier exists in a list of other data block identifiers, the second data block identifier being calculated based on data of a second data block; when it is determined that the second data block identifier matching the first data block identifier exists, deleting the first data block; and when it is determined that the second data block identifier matching the first data block identifier does not exist, adding the first data block identifier to the list.

In accordance with systems consistent with the present invention, a data processing system is provided. The data processing system comprises: a secondary storage device having a stored data block with data; a memory comprising a computer program that obtains a first data block identifier for a first data block, the first data block identifier being calculated based on data of the first data block, determines whether a second data block identifier matching the first data block identifier exists, the second data block identifier being calculated based on data of a second data block, and when it is determined that the second data block identifier matching the first data block identifier exists, indicates that the first data block identifier is redundant; and a processing unit that runs the computer program.

In accordance with the present invention, a data processing system is provided. The data processing system comprises: a secondary storage device having a stored data block with data; a memory comprising a computer program that receives a request for a reference to a memory location that stores data, the request comprising the data, creates a new identifier that is based on the data, determines whether the new identifier is equivalent to one of the associated identifiers, and when it is determined that the new identifier is equivalent to one of the associated identifiers, returns a reference to the data block that is associated with the one associated identifier; and a processing unit that runs the computer program.

In accordance with systems consistent with the present invention, a data processing system is provided. The data processing system comprises: a secondary storage device having a stored data block with data; a memory comprising a computer program that obtains a first data block identifier for a first data block, the first data block identifier being calculated based on data of the first data block, generates a memory allocation request for the first data block, transmits the memory allocation request to a redundancy handler, the memory allocation request instructing the redundancy handler to determine whether a second data block identifier matching the first data block identifier exists, wherein the second data block identifier is calculated based on data of a second data block, and receives an allocation response indicating whether the second data block identifier of the second data block exists; and a processing unit that runs the computer program.

In accordance with systems consistent with the present invention, a data processing system for eliminating data redundancies is provided. The data processing system comprises: means for obtaining a first data block identifier for a first data block, the first data block identifier being calculated based on data of the first data block; means for determining whether a second data block identifier matching the first data block identifier exists, the second data block identifier being calculated based on data of a second data block; and means for, when it is determined that the second data block identifier matching the first data block identifier exists, indicating that the first data block identifier is redundant.

In accordance with systems consistent with the present invention, a data processing system for eliminating data redundancies, the data processing system having data blocks with associated identifiers, is provided. The data processing system comprises: means for receiving a request for a reference to a memory location that stores data, the request comprising the data; means for creating a new identifier that is based on the data; means for determining whether the new identifier is equivalent to one of the associated identifiers; means for, when it is determined that the new identifier is equivalent to one of the associated identifiers, means for returning a reference to the data block that is associated with the one associated identifier.

In accordance with systems consistent with the present invention, a data processing system for eliminating data redundancies is provided. The data processing system comprises: means for obtaining a first data block identifier for a first data block, the first data block identifier being calculated based on data of the first data block; means for generating a memory allocation request for the first data block; means for transmitting the memory allocation request to a redundancy handler, the memory allocation request instructing the redundancy handler to determine whether a second data block identifier matching the first data block identifier exists, wherein the second data block identifier is calculated based on data of a second data block; and means for receiving an allocation response indicating whether the second data block identifier of the second data block exists.

In accordance with systems consistent with the present invention, a data processing system for eliminating data redundancies is provided. The data processing system comprises: means for receiving a first data block; means for calculating a first data block identifier based on data of the first data block; means for determining whether a second data block identifier matching the first data block identifier exists in a list of other data block identifiers, the second data block identifier being calculated based on data of a second data block; means for, when it is determined that the second data block identifier matching the first data block identifier exists, deleting the first data block; and means for, when it is determined that the second data block identifier matching the first data block identifier does not exist, adding the first data block identifier to the list.

In accordance with articles of manufacture consistent with the present invention, a computer-readable memory device encoded with a data structure and a program that accesses the data structure is provided. The program is run by a processor in a data processing system, the data structure having a plurality of entries, each entry comprising: a reference to a data block that contains data and an identifier that is based on the data using a calculation, wherein when the program receives a request to create a new data block containing new data, the program creates a new identifier based on the new data using the calculation and compares the new identifier to the identifiers in the entries to prevent a data block redundancy.

The above-mentioned and other features, utilities, and advantages of the invention will become apparent from the following detailed description of the preferred embodiments of the invention together with the accompanying drawings.

Other systems, methods, features, and advantages of the invention will become apparent to one with skill in the art upon examination of the following figures and detailed description. It is intended that all such additional systems, methods, features, and advantages be included within this description, be within the scope of the invention, and be protected by the accompanying drawings.

BRIEF DESCRIPTION OF THE DRAWINGS

The accompanying drawings, which are incorporated in and constitute a part of this specification, illustrate an implementation of the invention and, together with the description, serve to explain the advantages and principles of the invention. In the drawings.

FIG. 6 depicts a block diagram of a client-server based data processing system suitable for methods and systems consistent with the present invention;

DETAILED DESCRIPTION OF THE INVENTION

Reference will now be made in detail to an implementation consistent with the present invention as illustrated in the accompanying drawings. Wherever possible, the same reference numbers will be used throughout the drawings and the following description to refer to the same or like parts.

In accordance with methods, systems, and articles of manufacture consistent with the present invention, data redundancies are eliminated by determining whether newly received data blocks are redundant to previously received data blocks. A data block identifier for a newly received data block is obtained and compared to known data block identifiers. The data block identifiers are, for example, checksums. If it is determined that the data block identifier already exists, then it is known that the data block was previously received. Thus, the newly-received data block can be identified accordingly. For example, the newly-received data block can be deleted.

For example, if two processes transmit identical data blocks at different times, when the latter data block is received, its data block identifier is obtained and compared to known data block identifiers. If it is determine that the data block identifier already exists, then it is known that the data block has already been received. Accordingly, the latter data block can, for example, be deleted.

Figure 1:
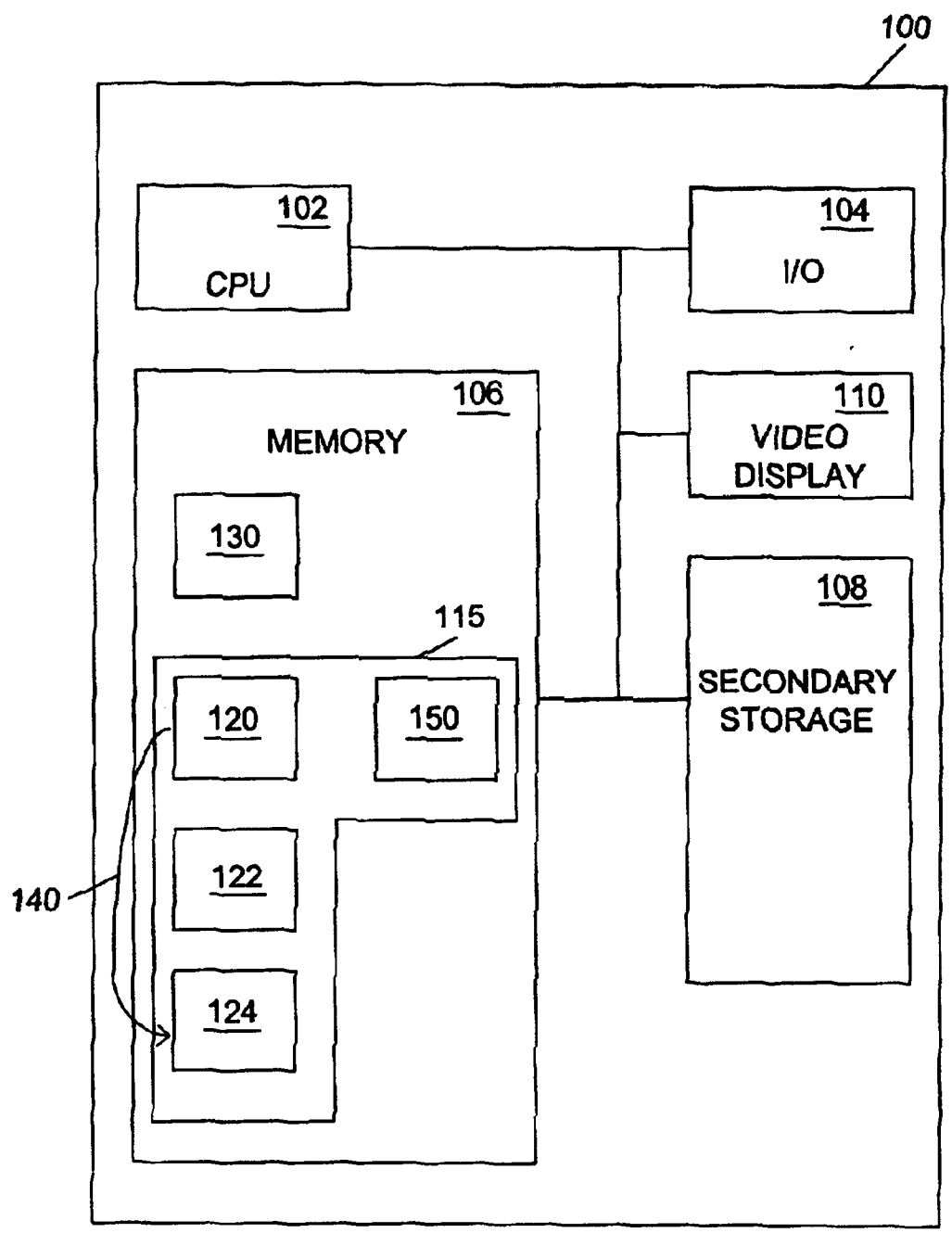
FIG. 1 depicts a block diagram of a data processing system suitable for methods and systems consistent with the present invention.

FIG. 1 depicts a block diagram of a data processing system 100 suitable for practicing methods and implementing systems consistent with the present invention. Data processing system 100 comprises a central processing unit (CPU) 102, an input output I/O unit 104, a memory 106, a secondary storage device 108, and a video display 110. Data processing system 100 may further comprise standard input devices such as a keyboard, a mouse or a speech processing means (each not illustrated).

Memory 106 contains a computer program 115, which comprises an identifier obtaining code piece 120, a determining code piece 122, and a redundancy code piece 124. The term code piece refers to one or more lines of program code. In summary, identifier obtaining code piece 120 obtains a data block identifier for a current data block 130. Identifier obtaining code piece 120 can be capable of calculating a large number of data block identifiers in a short period of time, such as data block identifiers for data blocks received from one or a plurality of sources. Determining code piece 122 determines whether the data block identifier obtained by identifier obtaining code piece 120 already exists for another data block. Redundancy code piece 124 performs redundancy operations responsive to a determination result of determining code piece 122. A redundancy operation may, for example, include marking the corresponding data block as being redundant or not redundant, or may involve further handling operations for treating the data block as being redundant or not redundant. The specific information that is contained in the code pieces described herein depends on the specific programming language used to write the code pieces.

Each of these code pieces will be described in more detail below. These code pieces may comprise or may be included in one or more code sections containing instructions for performing their respective operations. While computer program 115 is described as being implemented as software, the present implementation may be implemented as a combination of hardware and software or hardware alone. Also, one of skill in the art will appreciate that computer program 115 may comprise or may be included in a data processing device, which may be a server, communicating with data processing system 100.

Figure 2:
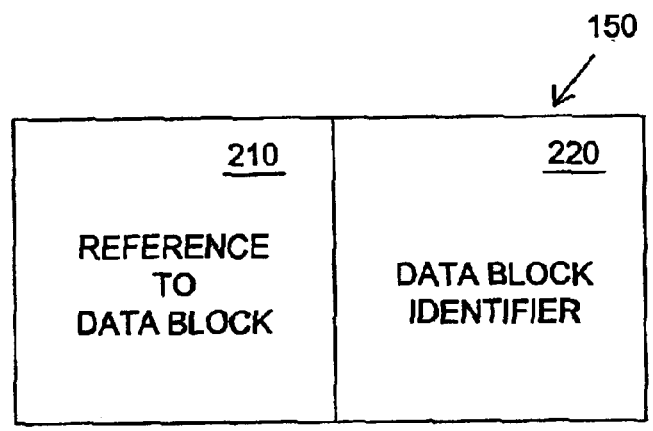
FIG. 2 depicts a block diagram of a data structure suitable for methods and systems consistent with the present invention.

Identifier obtaining code piece 120 includes a data structure 150 having an entry reflecting a reference to a data block that contains data and an identifier that is based on the data using a calculation, wherein when the computer program receives a request to create a new data block containing new data, the computer program creates a new identifier based on the new data using the calculation and compares the new identifier to the identifiers in the entries to prevent a data block redundancy, as will be described in more detail below. A block diagram of the data structure is depicted in FIG. 2. As illustrated, data structure 150 comprises a reference to a data block 210 and a corresponding data block identifier 220.

Referring back to FIG. 1, although aspects of one implementation are depicted as being stored in memory, one skilled in the art will appreciate that all or part of systems and methods consistent with the present invention may be stored on or read from other computer-readable media, such as secondary storage devices, like hard disks, floppy disks, and CD-ROM; a carrier wave received from a network such as the Internet; or other forms of ROM or RAM either currently known or later developed. Further, although specific components of data processing system 100 have been described, one skilled in the art will appreciate that a data processing system suitable for use with methods, systems, and articles of manufacture consistent with the present invention may contain additional or different components.

Figure 3:
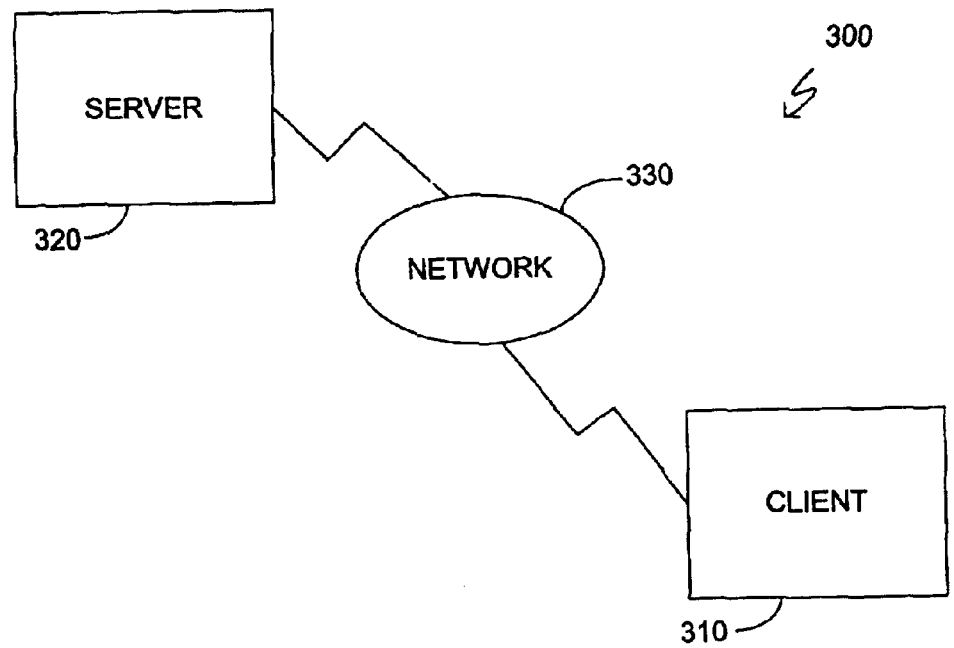
FIG. 3 depicts a block diagram of a client-server based data processing system suitable for methods and systems consistent with the present invention.

One skilled in the art will appreciate that methods, systems, and articles of manufacture consistent with the present invention may also be implemented in a client-server environment, like the one depicted in FIG. 3. FIG. 3 depicts a block diagram of a client-server based data processing system 300 with which methods, systems, and articles of manufacture consistent with the present invention may be implemented. A client computer system 310 and a server computer system 320 are each connected to a network 330, such as a Local Area Network, Wide Area Network, or the Internet. At least a portion of computer program 115 can be stored on client computer system 310 while some or all steps of the processing as described below can be carried out on server computer system 320, which is accessed by client computer system 310 over network 330. Client computer system 310 and server computer system 320 can each comprise components similar to those described above with respect to data processing system 100, such as a CPU, an I/O, a memory, a secondary storage, and a video display.

Figure 4:
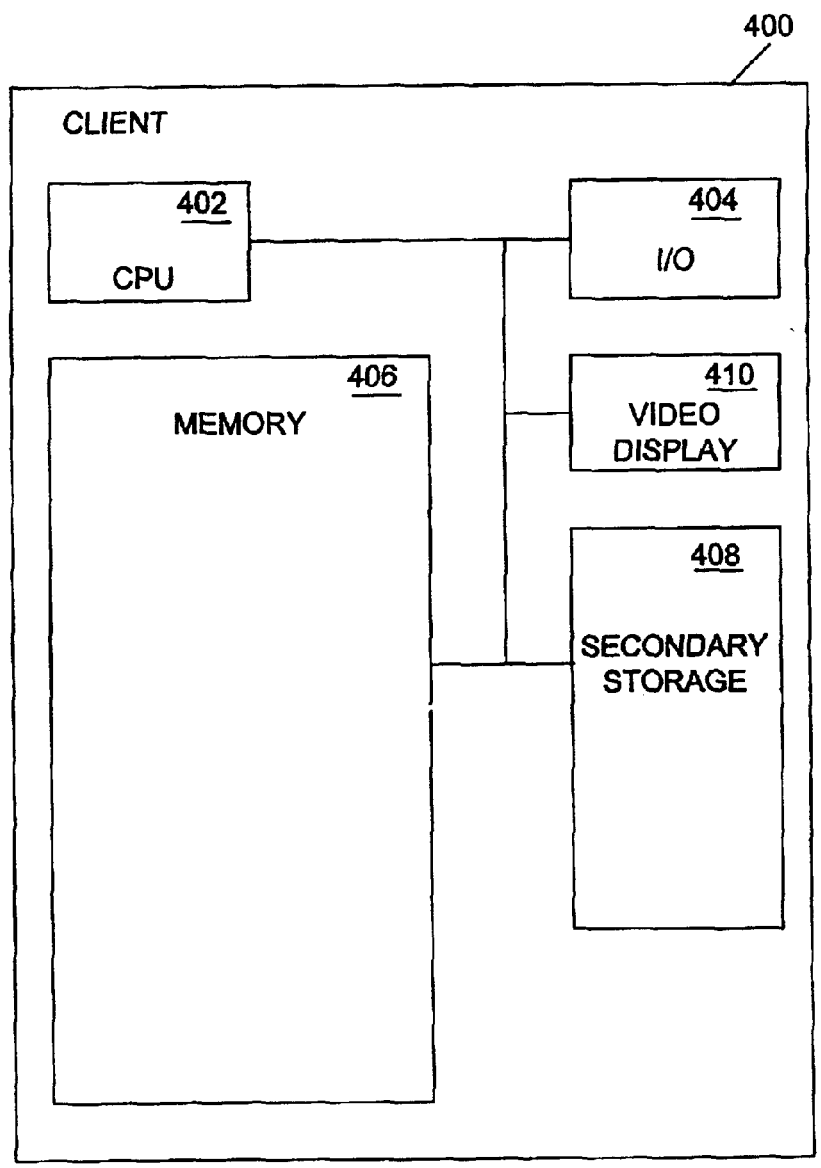
FIG. 4 depicts a block diagram of a client data processing system of the client-server based data processing system of FIG. 3.

FIG. 4 depicts a block diagram of an illustrative client computer system 400 suitable for practicing methods and implementing systems consistent with the present invention. Client computer system 310 of FIG. 3 can comprise, for example, a data processing system similar to client computer system 400. Client computer system 400 comprises a central processing unit (CPU) 402, an input output I/O unit 404, a memory 406, a secondary storage device 408, and a video display 410. Data processing system 100 may further comprise standard input devices such as a keyboard, a mouse or a speech processing means (each not illustrated).

Figure 5A:
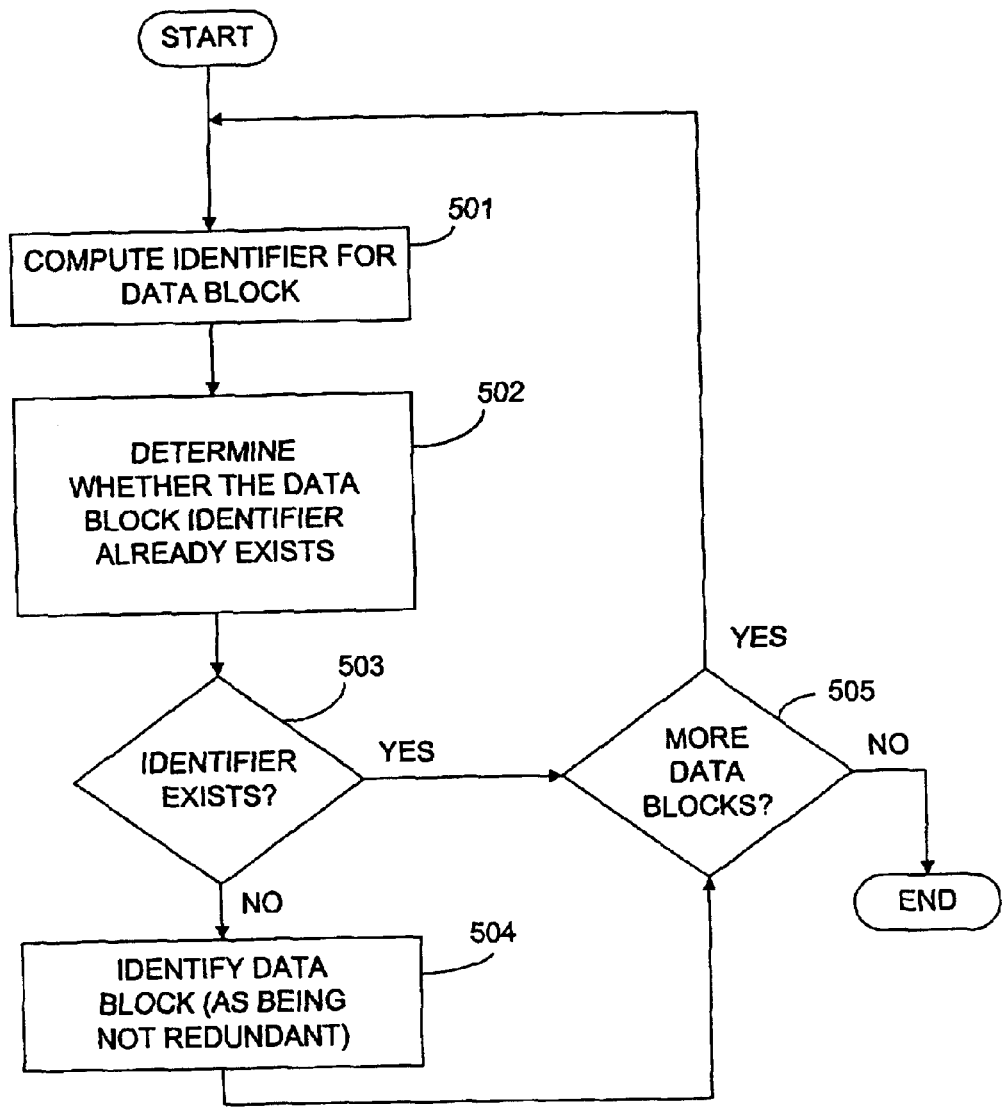
FIG. 5a depicts a flow diagram illustrating the steps for eliminating data redundancies in accordance with an embodiment consistent with the present invention.

FIG. 5a depicts a flow diagram illustrating exemplary steps for eliminating data redundancies in accordance with methods, systems, and articles of manufacture consistent with the present invention. It is assumed that a current data block has been received by computer program 115 from an arbitrary source, such as from secondary storage. A received data block may comprise any kind of data, such as text information, video information, audio information or other information constituting software programs. Data blocks may have a predetermined length, in which case data files or data streams may be suitably partitioned into data blocks.

However, it is also possible that the data blocks have variable length, for example if a data block corresponds to a data file, a software program, or a program module.

Also, the data blocks may comprise a sequence of binary bits, e.g., arranged in information bytes. However, the data blocks do not have to be embodied as binary information, they can by embodied as any other type of representation.

In FIG. 5a, first, identifier obtaining code piece 120 of the computer program obtains a data block identifier for the current data block (step 501). In obtaining the data block identifier, identifier obtaining code piece 120 either obtains the data block identifier from an external source, such as from a list of data block identifiers on secondary storage, or calculates the data block identifier for the current data block based on data in the current data block.

For example, identifier obtaining code piece 120 can calculate the data block identifier as a checksum based on the data in the data block. A checksum generally is a value used to ensure data is stored or transmitted without error. In this case, a checksum is used to identify a data block. Identifier obtaining code piece 120 can obtain the checksum by calculating the binary values in the data block using an algorithm, such as a CRC (cyclical redundancy checking) checksum algorithm. As is known to one of skill in the art, CRC is an error checking technique that may be used to ensure the accuracy of transmitted digital information. The transmitted digital information may be divided into predetermined blocks which, used as dividends, may be divided by a fixed divisor.

Alternatively, identifier obtaining code piece 120 can calculate any other type of suitable data block identifier. If, for example, the data of the data block is not embodied as digital information, then identifier obtaining code piece 120 may characterize the data block identifier as a unique identifier information characterizing the data block, such as a frequency spectrum. In this case, identifier obtaining code piece 120 would convert the data format of the data block from an analog to a digital format in order to facilitate computing the data block identifier, such as, as a checksum. Further, identifier obtaining code piece 120 may utilize a hash code, e.g., including words or characters, in connection with a hash table, in order to calculate the data block identifier.

The data block identifier obtained by identifier obtaining code piece 120 is then used by the determining code piece 122, as indicated by arrow 140 in FIG. 1.

Referring back to FIG. 5a, determining code piece 122 then determines whether the data block identifier already exists (steps 502 and 503). For the determining operation, determining code piece 122 may obtain information from a list of data block identifiers in preparation of performing the determining operation. If a data block identifier matching the current data block identifier is already available, then determining code piece 122 indicates that a data block identical to the current data block is already known. Likewise, if determining code piece 122 determines that a data block identifier matching the current data block identifier is not already known, then determining code piece 122 indicates that the corresponding data block has not been identified before, i.e., the data block is not redundant. Determining code piece 122 makes these indications regarding redundancy as described in more detail below.

Determining code piece 122 may maintain or access information on data block identifiers of known identified data blocks, in order to perform the determination operation. The information can be in the form of a list maintained by determining code piece 122, for example, in the memory, the secondary storage, or an external storage. The determination operation comprises a comparison operation of the current data block identifier with the data block identifiers already known by the determining code piece 122.

Determining code piece 122's determination result indicates whether the current data block identifier already exists, i.e., is redundant or not redundant.

If determining code piece 122 determines in step 503 that the data block identifier does not already exist, then redundancy code piece 124 identifies the data block as being not redundant (step 504). Redundancy code piece 124 treats the data block depending on the determination result. For example, redundancy code piece 124 could mark the data block as being redundant, if it was determined in step 503 that the data block identifier already exists. Alternatively, if the data block identifier does not already exist, redundancy code piece 124 could mark the current data block as not being redundant. Redundancy code piece 124 marks the data block by, for example, setting or resetting a flag associated with the data block.

In dependence on the marking result, i.e., the mark indicating that a data block is redundant or not redundant, redundancy code piece 124 can perform further processing for handling the data block. For example, if it is determined that the data block identifier already exists in step 503, then redundancy code piece 124 could delete the current data block from where it is stored, e.g., from memory or secondary storage. Thus, a storage space used for the storage of a number of data blocks can be minimized. If a plurality of applications already allocated storage space for the same data block, redundancy code piece 124 can therefore remove unnecessary copies of the data block. Further, in a collection of large numbers of data blocks, for example in program libraries, redundancy code piece 124 can remove unnecessary duplicates of a data block.

Alternatively, when there is a redundant data block identifier, redundancy code piece 124 could replace the current data block with a reference to a storage location storing the identical data block. For example, if a plurality of application programs, modules of application programs or processes individually allocated storage space for identical data blocks and unnecessary duplicate copies of information were removed as outlined above, runtime errors during memory accesses could result. However, if deleted copies of data are replaced by references, and processes attempt to access the data block for processing operations, runtime errors can be avoided, since a process, trying to access a removed copy of the data block, could be redirected to another location storing the data block.

Further, if determining code piece 124 determines that the data block identifier already exists, the computer program can effect the storage of the current data block on a computer-readable medium, such as those described above.

Likewise, if the determination result indicates that the data block is not redundant, i.e., was not already identified, the computer program can effect the storage of the current data block on a computer-readable medium, such as those described above. For example, if a program library is to be stored on a computer-readable medium, such as in a RAM or on a hard disk or compact disc, memory space would be allocated for data blocks which are not redundant.

The same considerations apply, if a plurality of application programs or program modules attempt to allocate memory for the same data block. If the data block is not redundant and thus not already available, the application program or application module can be authorized by the computer program to allocate memory on the computer-readable medium. If the data block is already available, the application program or application module can instead be provided by the computer program with a reference to another memory location storing the data block.

Further, if the data block is not redundant, the computer program can transmit the data block to a receiving unit, e.g., via a network or dedicated communication links including wireless transmissions. For example, if a collection of data blocks is to be transmitted from a server unit to a client unit, data blocks that are not redundant can be transmitted to the client unit for further processing.

If determining code piece 122 determines in step 503 that the data block identifier already exists or after redundancy code piece 124 identifies the data block as being redundant in step 504, then the computer program determines whether there is another received data block (step 505). If there is another received data block, then the flow returns to step 501.

Thus, methods, systems, and articles of manufacture consistent with the present invention allow the elimination of data redundancies in a plurality of data blocks by determining data block identifiers for each data block to be identified and by determining whether a corresponding data block identifier is already available. If such a data block identifier is not available, the data block may be identified as not redundant. If such a data block identifier is available, the data block may be identified as redundant, and effecting suitable handling of the data block, such as deletion or replacement of the data block.

The sequence of method steps depicted in the embodiment shown in FIG. 5a may advantageously be used to generate a collection of non-redundant data blocks, e.g., for storage on a computer-readable medium or for transmission to a receiving unit. Thus, if a data block is not redundant, the data block is identified, e.g., stored or transmitted. For example if the computer program receives a stream of data blocks, including redundant versions of some of the data blocks, the embodiments of the present invention can be used as a filter to store or transmit data blocks that were not received at an earlier point in time.

It is noted that while the steps depicted in the flow diagrams of this disclosure are illustrated in a particular sequence, the sequences may be varied, for example steps may be interchanged or omitted.

Figure 5B:
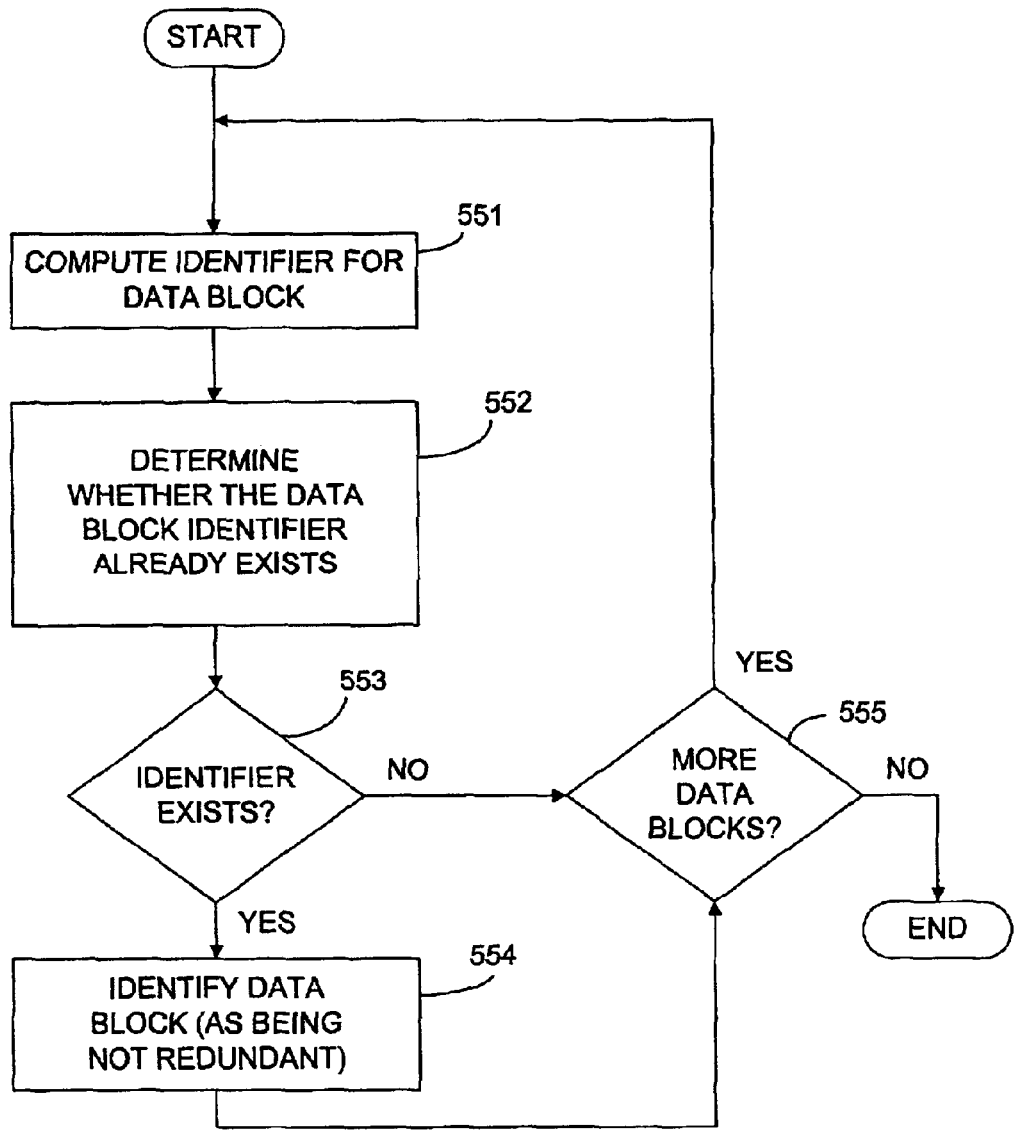
FIG. 5b depicts a flow diagram illustrating the steps for eliminating data redundancies in accordance with another embodiment consistent with the present invention.

Referring to FIG. 5b, FIG. 5b depicts a flow diagram illustrating exemplary steps for eliminating data redundancies according to another embodiment of the present invention.

Similar to the flow diagram of FIG. 5a, in FIG. 5b, first, identifier obtaining code piece 120 obtains a data block identifier for a current data block (step 551).

Then, determining code piece 122 determines from a list of data block identifiers whether the obtained data block identifier from step 551 already exists (step 552). As described above with reference to FIG. 5a, this determination can be based on a list of data block identifiers of data blocks that have been already identified at an earlier point in time.

Then, determining code piece 122 determines whether the obtained data block identifier already exists (step 553).

If determining code piece 122 determines that the data block identifier already exists in step 553, then redundancy code piece 124 identifies the data block as being redundant (step 554). Identifying the data block as being redundant may include deleting the data block from where it is stored, or replacing the data block with a reference to another memory location already storing the data block, or returning to a requesting unit a reference to the other memory location already storing the data block.

If determining code piece 122 determines that the data block identifier does not already exist in step 553 or after the data block is identified as being redundant in step 554, then the computer program determines whether there is another data block (step 555). If there is another data block, then flow returns to step 551 for computing the data block identifier of the next data block.

While the embodiment of FIG. 5a may be used as a filter for passing non-redundant data blocks, the embodiment of FIG. 5b may be used to clean up a computer-readable medium by removing redundant data blocks and, if necessary, by replacing redundant data blocks with references to other memory locations storing the data block or by returning references to such memory locations. Accordingly, the embodiment of FIG. 5b may be used to reduce memory space required for a given number of data blocks, e.g., where a plurality of application programs or application modules partially allocated memory space for identical data blocks.

Alternatively, if in step 253 the determining code piece 122 determines that the data block identifier does not already exist, before returning to step 551 for a subsequent data block, the current data block could be identified as described above with reference to step 504.

In the following, a further embodiment of the present invention will be described with respect to FIG. 6. Referring to FIG. 6, FIG. 6 depicts a block diagram of a system for eliminating data redundancies in accordance with another embodiment of the present invention. As illustrated, data processing system 100 is similar to its depiction in FIG. 1 with a few alterations as described below. Again, data processing system 100 has memory 106 containing computer program 115, which comprises identifier obtaining code piece 120, determining code piece 122, and redundancy code piece 124.

Further, memory 106 contains a list of data block identifiers 602. The list of data block identifiers 602 comprises a collection of data block identifiers and may comprise further information associated with data blocks. The list of data block identifiers may be stored, for example, in memory or secondary storage.

In the illustrated embodiment, data processing system 100 is a server data processing system that communicates with a client data processing system 604 via a network 606. Client data processing system 604 contains a client secondary storage 608. Also, client data processing system 604 can be similar to the client data processing system 400 described above with reference to FIG. 4.

As will be described in more detail below, data blocks can be received by the computer program from, for example, secondary storage 108. Alternatively, the data block can be received from, for example, a computer readable medium. Further, data blocks for registration can be transmitted by the computer program to client data processing system 604, as indicated by arrow 610. At client data processing system 604 the transmitted data blocks can be stored, for example, in client secondary storage 608 or on a computer-readable medium. Thus, client secondary storage 608 can be used to store data blocks which are identified as not being redundant. Client data processing device 604 can therefore be a general purpose data processing device operated by a user who wishes to obtain a collection of data blocks with eliminated redundancies.

Figure 7:
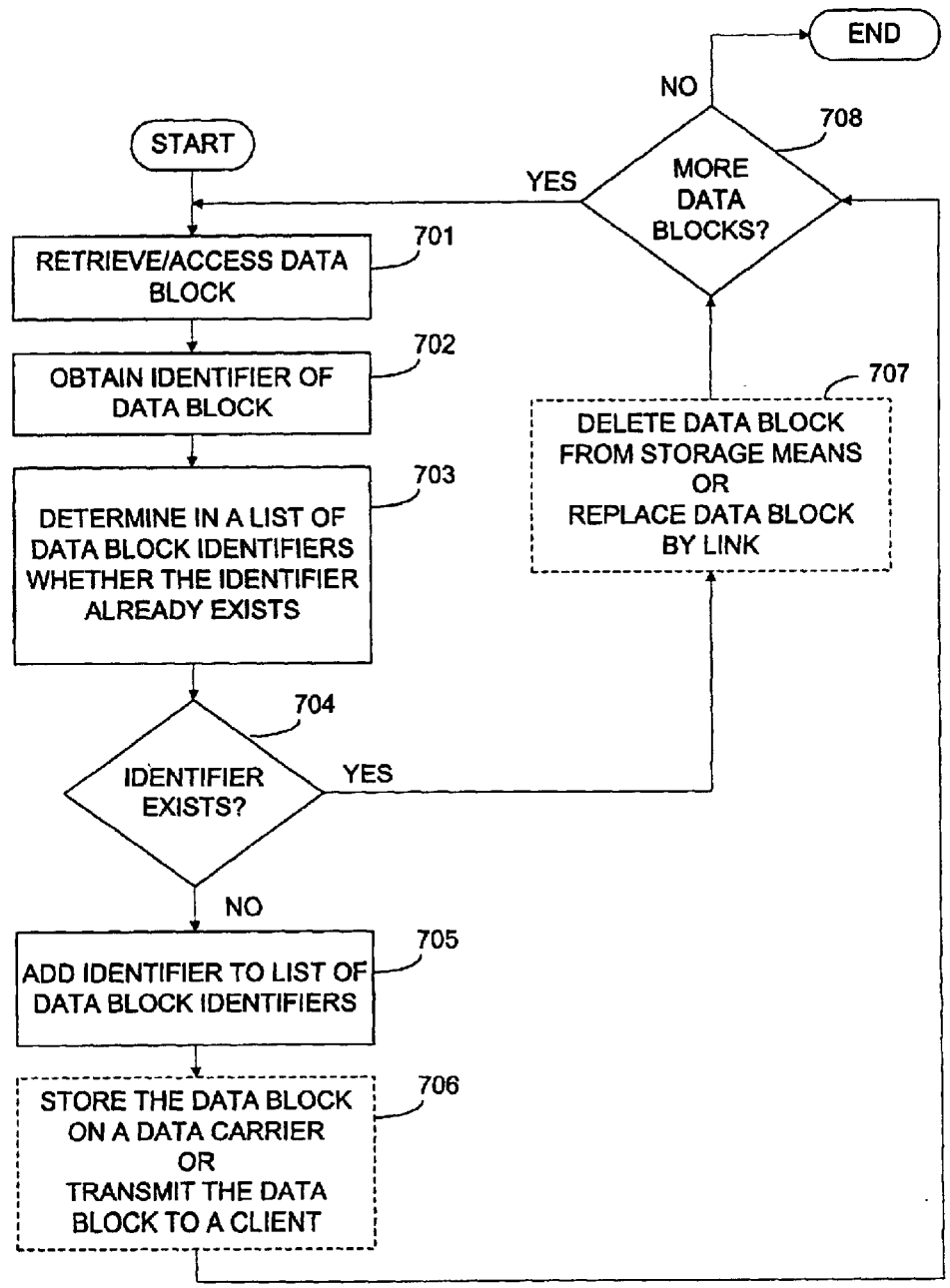
FIG. 7 depicts a flow diagram illustrating the steps for eliminating data redundancies in accordance with another embodiment consistent with the present invention.

FIG. 7 depicts a flow diagram illustrating exemplary steps for eliminating data redundancies in accordance with methods, systems, and articles of manufacture consistent with the embodiment depicted in FIG. 6. Similar to the flow diagram of FIG. 5, it is assumed that a current data block has been received by the computer program from an arbitrary source, such as from secondary storage. Also, the data block can be similar to the data block described above with reference to FIG. 5. FIG. 7 particularly describes operations for maintaining a list of data block identifiers up to date, in accordance with a determination result indicating that a data block is redundant or not redundant.

In FIG. 7, first, the computer program retrieves or accesses a current data block from, for example, secondary storage 108 (step 701). The data block may be, for example, part of an application program or data needed by a process.

Then, identifier obtaining code piece 120 obtains a data block identifier for the retrieved data block as described above with reference to FIG. 5 (step 702).

Then, determining code piece 122 references the list of data block identifiers to determine whether the obtained current data block identifier already exists, i.e., whether the data block identifier is already identified (step 703). The operation of step 403 may be similar to the corresponding operation described above with reference to FIG. 5. The determined results are evaluated in step 704.

If determining code piece 122 determines that the current data block identifier does not already exist in step 704, then determining code piece 122 appends the obtained data block identifier to the list of data block identifiers (step 705). This is depicted in FIG. 6 as arrow 612. Further, determining code piece 122 can store an address, such as a pointer, of the data block corresponding to the data block identifier in association with the data block identifier, for example, in the list of data block identifiers. The address may specify a memory location storing information about the data block. Thus, the list of data block identifiers can include a collection of data block identifiers and addresses of data blocks corresponding to the data block identifiers. Alternatively, determining code piece 122 can store the data block identifiers in association with the data blocks themselves.

Referring back to FIG. 7, after step 705 is completed, in an optional step 706, as indicated by the dotted line, redundancy code piece 124 can process the current data file, e.g., by storing it on a computer-readable medium or transmitting it to a client, as described above with reference to FIG. 5. Step 706 may thus correspond identifying the corresponding data block as being non-redundant.

If determining code piece 122 determines that the current data block identifier already exists in step 704, that is the data block is redundant, in an optional step 707, as indicated by the dotted line, redundancy code piece 124 may identify the data block as being redundant. In this latter case, redundancy code piece 124 can also delete the data block or replace the data block with a reference, as described above with reference to FIG. 5.

If it is determined that the data block identifier exists in step 704 (or after step 707 if step 707 is used) or after step 705 (or 706, if used), then the computer program determines whether there is another data block (step 708). If the computer program determines that there is another data block in step 708, then flow returns to step 701.

Therefore, the system depicted in FIG. 6 may be used as a filter for transmitting data blocks determined to be non-redundant and for retaining, that is discarding, data blocks which are determined to be redundant.

However, the system depicted in FIG. 6 is not limited thereto. The system depicted in FIG. 6 may be implemented using the above-described method steps depicted in FIGS. 5a and 5b. That is, the system depicted in FIG. 6 may be used to eliminate redundant data blocks from a storage means. In this case, secondary storage 108 and client secondary storage 608 can comprise a single secondary storage and redundancy code piece 124 can delete redundant data blocks from the single secondary storage or replace data blocks with references, as described above. Thus, memory allocated for a plurality of data blocks by a plurality of application programs or application modules, including redundant allocations of data blocks, could be cleaned by the redundancy code piece for reducing the storage amount that is needed.

Further, the system depicted in FIG. 6 maintains an up-to-date collection of data block identifiers corresponding to already identified data blocks, in order to provide a fast redundancy identifying operation for data blocks while avoiding redundancies.

Figure 8:
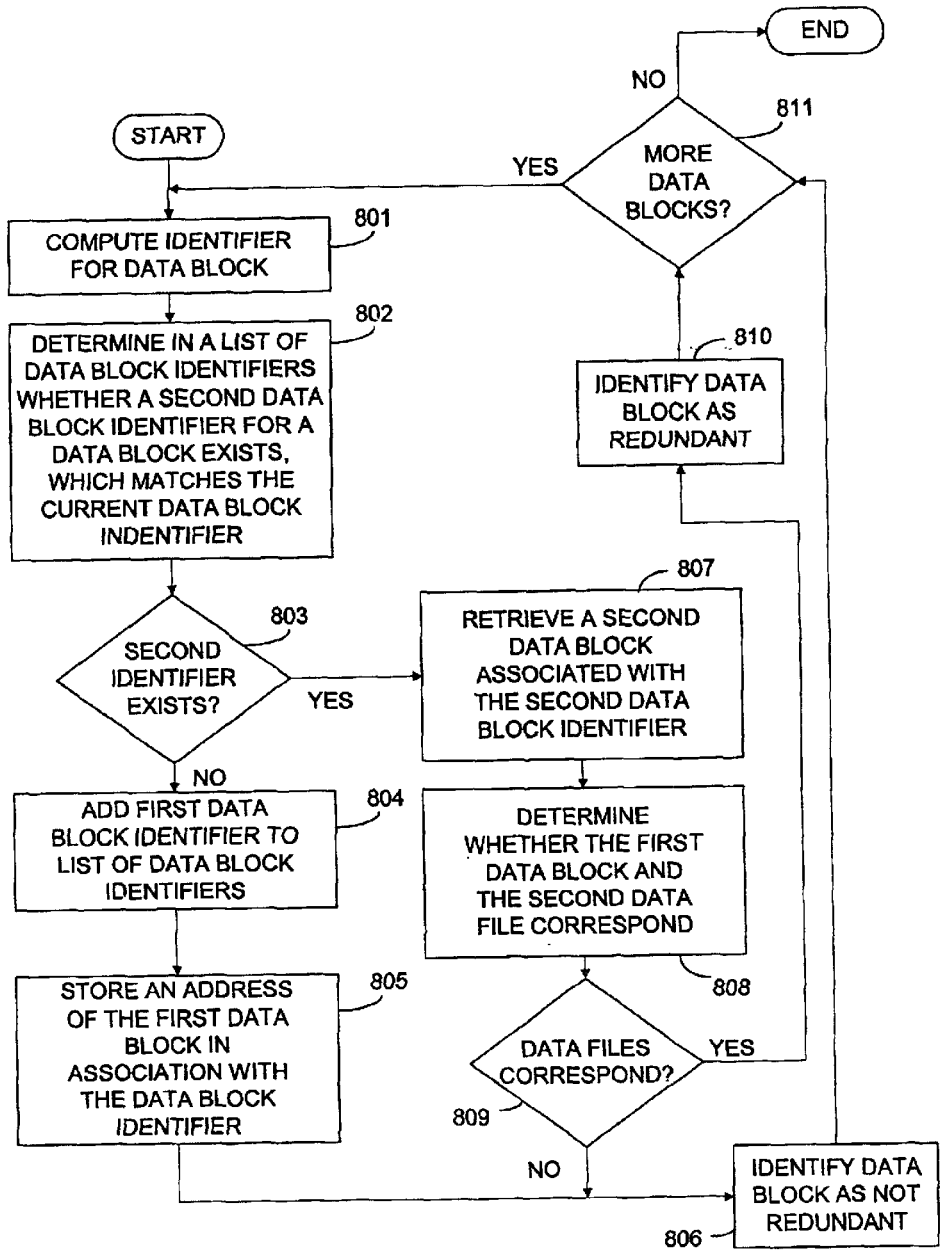
FIG. 8 depicts a flow diagram illustrating the steps for eliminating data redundancies in accordance with another embodiment consistent with the present invention.

Referring to FIG. 8, FIG. 8 is a flow diagram depicting exemplary steps for eliminating data redundancies according to another embodiment of the present invention. The steps of FIG. 8 may be carried out using the system shown, for example, in FIG. 1 or 6, however the steps of FIG. 8 are not limited thereto.

In general, FIG. 8 outlines the steps that may be carried out upon determining that a data block identifier is already available. As a data block identifier may not be unique, it may occur that two data block identifiers are identical, while the corresponding data blocks contain different information. In this case, further processing is necessary in order to determine whether the data blocks indeed contain the same information.

In FIG. 8, first, the identifier obtaining code piece obtains a first data block identifier for a current, first data block, for example as described above with respect to previously described embodiments (step 801).

Then, the determining code piece determines, for example from a list of data block identifiers, whether a second data block identifier for a second data block exists that matches the first data block identifier obtained in step 801 (step 802). Step 802 may be similar to corresponding operations outlined above with respect to previously described embodiments. The determined results are evaluated in step 803.

If the determining code piece determines in step 803 that the second data block identifier does not already exist, then the determining code piece appends the first data block identifier obtained in step 801 to the list of data block identifiers, e.g., as described above with reference to FIG. 7 (step 804).

Then, the determining code piece stores an address of the first data block in association with the first data block identifier (step 805). The address may be any information usable to retrieve the corresponding first data block, e.g., an address of a storage location or of another suitable source for providing the first data block.

Thus, the data block identifier will include addresses of data blocks in association with the computed data block identifiers, facilitating handling the data block as being redundant or not redundant, e.g., generating and transmitting a reference to a data block.

If the determining code piece determines in step 803 that the first data block identifier of the current data block already exists, e.g., in the list of data block identifiers, then the determining code piece retrieves a second data block corresponding to the second data block identifier (step 807). Step 807 may for example be carried out by using an address of the second data block stored in association with the second data block identifier in the list of data block identifiers.

Then, determining code piece 124 determines whether the information of the first data block and the second data block correspond to one another (step 808). Thus, the present embodiment provides further security for determining equality of data blocks in cases where data blocks associated with identical data block identifiers contain different information.

The determining operation of step 808 may include performing a suitable processing operation for determining whether the two data blocks correspond to one another, including for example computing a more detailed data block identifier for the two data blocks, such as data block identifiers having more bits than the initially computed data block identifiers. Thus, it can be conveniently double-checked whether the data blocks are actually identical or not.

In accordance therewith, the computed first data block identifier could be a low level data block identifier in order to ensure a high throughput of data blocks in redundancy identifying operations, and if data block identifiers are determined to correspond to one another, which may be a rare case, further higher level data block identifiers could be computed for making a final decision on equality of the data blocks.

Further, additional layering of processing operations could be performed. For example, a third data block identifier computation operation could be performed.

Still further, the processing operation could include comparing the considered data blocks on a bit by bit basis, in order to make a final decision on equality of the two considered data blocks.

Still further, the processing operation of step 808 may include at least one of comparing data block names of the data blocks, comparing dates indicating a time of creation of the data blocks, and comparing dates indicating a time of alteration of the data blocks.

Thus, a multi-layered determination operation may be performed for determining whether the data blocks are equal in step 808.

The determined results of step 808 are evaluated in step 809. If the determining code piece determines in step 809 that the data blocks correspond to one another, then the redundancy code piece identifies the first data block as being redundant (step 810). This identification is performed, for example, as described above with respect to the above-described embodiments.

If the determining code piece determines in step 809 that the data blocks do not correspond to one another, or after the address of the first data block is stored in step 805, then the redundancy code piece identifies the first data block as being not redundant (step 806). This identification is performed, for example, as described above with respect to the above-described embodiments.

After redundancy code piece identifies the first data block as redundant in step 810 or as not redundant in step 806, then the computer program determines whether there is another data block (step 811). If there is another data block in step 811, then flow returns to step 801.

Further, in this embodiment, the determining code piece can store a higher level data block identifier in the list of data block identifiers or in a separate list of data block identifiers for storing higher level data block identifiers. Then, if in step 803 it is determined that the data block identifier computed in step 801 already exists, in a further operation the higher level data block identifier could be computed by the identifier obtaining code piece for the data block and compared with the list of higher level data block identifiers by the determining code piece.

Thus, the data block identifier computation and comparison operation can be cascaded into a plurality of levels.

The embodiment of FIG. 8 may advantageously be employed in a process where a large number of data blocks is to be stored on a compact disc, or other fixed storage or, e.g., on a server unit for download by client units. In this case, the redundancy removal operations with the cascaded comparison operation can securely avoid an erroneous elimination of a data block, while saving as much storage space as possible.

Figure 9:
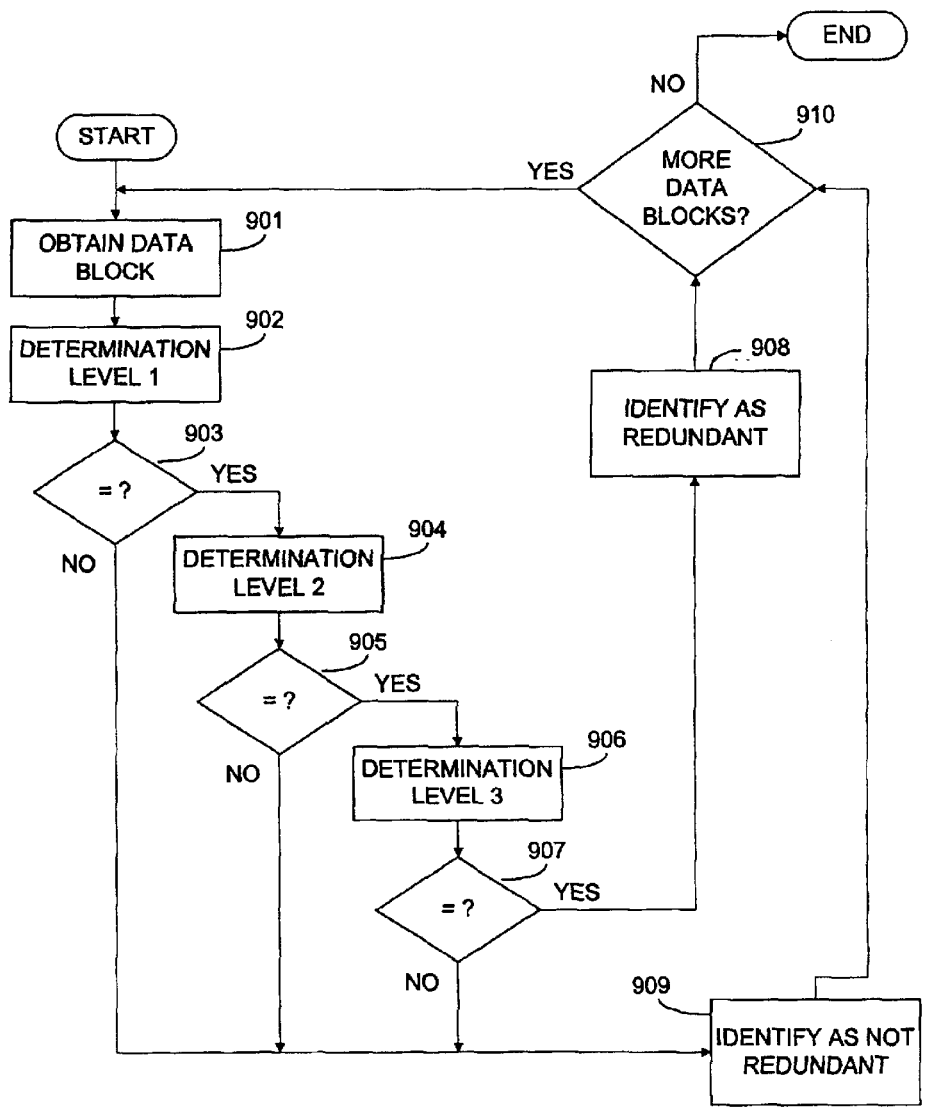
FIG. 9 depicts a flow diagram illustrating the steps for eliminating data redundancies in accordance with another embodiment consistent with the present invention.

Referring to FIG. 9, FIG. 9 depicts a flow diagram illustrating exemplary steps for eliminating data redundancies according to another embodiment of the present invention. FIG. 9 shows operations of a method for eliminating data redundancies according to another embodiment of the invention. The steps of FIG. 9 may be carried out using one of the embodiments of FIGS. 1 and 6, however, FIG. 9 is not limited thereto.

Similar to the embodiment depicted in FIG. 8, FIG. 9 depicts a multi-layered determination for identifying a data block as being redundant or being not redundant. In order to accelerate processing, a first determination level for determining redundancy of a data block may be kept low, i.e., a simple data block identifier could be obtained and compared to a list of data block identifiers or identifiers.

On the first determination level, the identifier or data block identifier may not be unique. In case a data block is determined to be redundant on this level, a further redundancy check is performed in another layer and, similarly, further layers may be provided.

In FIG. 9, first, the computer program receives a first data block, for example as described above with reference to the above-described embodiments (step 901). The identifier obtaining code piece obtains a first data block identifier for the first data block.

Then, the determining code piece performs a redundancy check of a first level to determine whether the first data block identifier already exists in a list of data block identifiers, for example as described above with reference to the above-described embodiments (step 902). On this first level each data block is considered, thus the first level data block identifiers could be relatively simple in order to reduce a processing time needed for the redundancy check. The determined results are evaluated in step 903.

Since the complexity of the first determination level can be fairly low, it may not be assured that the data block identifiers are unique. Thus, while the absence of a matching data block identifier surely identifies the data block as not being redundant, a matching data block identifier may not necessarily identify that the data block is redundant, as two data blocks having different data may lead to the same data block identifier.

Therefore, if in step 903 the determining code piece determines that a matching data block identifier was found, then a redundancy determination on a second determination level is performed in step 904. Step 904 may be similar to step 902, however, step 904 will include the computation of a more detailed data block identifier or other identifier for better identifying a corresponding data block.

Step 904 may be similar to steps 501 and 502 of FIG. 5a, steps 551 and 552 of FIG. 5b, or steps 702 and 703 of FIG. 7. The determined results are evaluated in step 905.

If the determining code piece determines in step 905 that there is a matching data block identifier, then the flow of operation proceeds to a third determination level redundancy check (step 906).

Step 906 may be similar to step 904, however, again involving the computation of another again more detailed data block identifier for the data block. If the third determination level, as in FIG. 9 exemplarily shown, is the last determination level, step 906 may include a bit by bit comparison of the corresponding data blocks. The determined results are evaluated in step 907.

In step 907, the determining code piece determines whether the data block identifiers or bit by bit comparison of the data blocks indicates redundancy of the considered data block. Thus, if the determining code piece determines that there is a redundancy, then the redundancy code piece identifies the data block as being redundant (step 908), for example as described above with reference to the previously-described embodiments.

Further, if in steps 903, 905, and 907 the determining code piece determines that the data block is not redundant, then the redundancy code piece identifies the data block as not being redundant (step 909), for example as described above with reference to the previously-described embodiments.

If the determining code piece determines that the data block is not redundant in steps 903, 905, and 907, then the determining code piece may store the correspondingly computed data block identifiers or identifiers in respective lists of data block identifiers of the respective determination level. Thus, for each determination level a list of data block identifiers may be maintained, e.g., with associated identifiers of corresponding data blocks, in order to facilitate the redundancy check on the respective levels.

The embodiment described with respect to FIG. 9 provides a reduction in processing requirements, as computationally more complex redundancy checks are only performed if a corresponding lower determination level indicates a quality of the data block identifiers.

Figure 10:
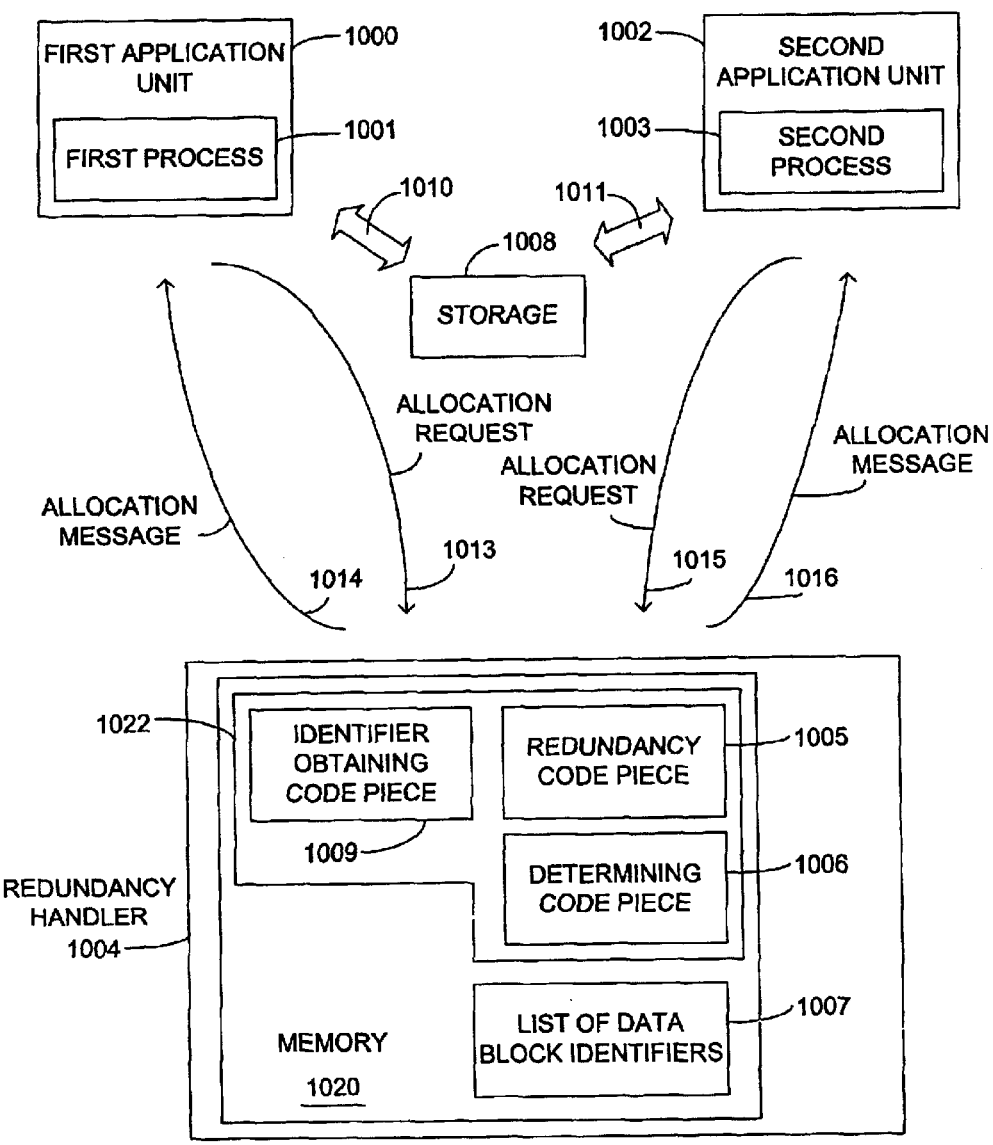
FIG. 10 depicts a block diagram of a data processing system suitable for methods and systems consistent with the present invention.

Referring to FIG. 10, FIG. 10 depicts a block diagram of a distributed data processing system for eliminating data redundancies in accordance with another embodiment of the present invention. A plurality of application programs or processes, wishing to allocate memory space for data blocks, perform a redundancy identifying operation using a redundancy handler in order to avoid multiple memory allocations for identical data blocks.

FIG. 10 illustrates a first application unit 1000 including a first process 1001.

Further, FIG. 10 illustrates a second application unit 1002 including a second process 1003.

A storage device 1008 is shared by the first application unit 1000 and the second application unit, as indicated by arrows 1010 and 1011.

A redundancy handler 1004 is similar, for example, to the data processing system 600 of FIG. 6. Accordingly, the redundancy handler comprises a memory 1020 including a computer program 1022, which comprises an identifier obtaining code piece 1009, a determining code piece 1006, and a redundancy code piece 1005. The memory also includes a list of data block identifiers 1007.

Redundancy handler 1004, first application unit 1000, second application unit 1002, and storage device 1008 can communicate with each other via, for example, a network (not shown).

In the following, the elements of the system for eliminating data redundancies shown in FIG. 10 will be described in further detail. It is noted that the following details are examples only and that the invention is not limited to the exact features given below.

First application unit 1000 may, for example, be a general purpose data processing unit executing an application program for providing a service to a user, e.g., a user operating the data processing unit. Therefore, first application unit 1000 can be similar, for example, to data processing units 100 and 600 of FIGS. 1 and 6 respectively.

Similarly, second application unit 1002 may be a general purpose data processing device for executing an application program for providing a service to a user operating the data processing device. Accordingly, second application unit 1002 can be similar, for example, to data processing units 100 and 600 of FIGS. 1 and 6 respectively. While in the illustrated embodiment, the first and second application units 1000 and 1002 are separate units, it is also possible that the units are formed by a single device, such as a single general purpose data processing unit. Also, while the first and second application units 1000 and 1002 may execute different application programs, it is also possible that the application units execute the same application program or execute different modules of a single application program.

First application unit 1000 includes first process 1001, for example a process in accordance with the application program or application module, running on a central processing unit of first application unit 1000.

Similarly, second application unit 1002 includes a second process 1003, which may be a process in connection with an application program or application module, running on a central processing unit of second application unit 1002.

If the first and second application units 1000 and 1002 form a single device, first process 1001 and second process 1003 may be processes in connection with a single application program or application module.

The first and second processes may provide services to users operating the corresponding application unit, for example, in connection with editing a document, retrieving data, playback of video information, or mathematical computations.

The storage device 1008 may be a separate storage device, such as a data base, or a suitable computer-readable medium as described above. The storage device 1008 may be connected to first application unit and second application unit via a network as described above.

Further, if the first application unit and the second application unit constitute a single device, the storage device may form a random access memory, hard disk, or computer-readable medium of the common device.

Redundancy handler 1004 functions as a central broker for allocation requests for memory space for data blocks received from the first application unit and the second application unit, as indicated by arrows 1013 and 1015. One of skill in the art will appreciate that redundancy handler can be implemented as software, hardware, or a combination of hardware and software.

The first and second application units or the first and second processes may generate such an allocation request, if the respective process needs a memory allocation for a certain data block, for example on a hard disc, a random access memory, or computer-readable medium.

Figure 11:
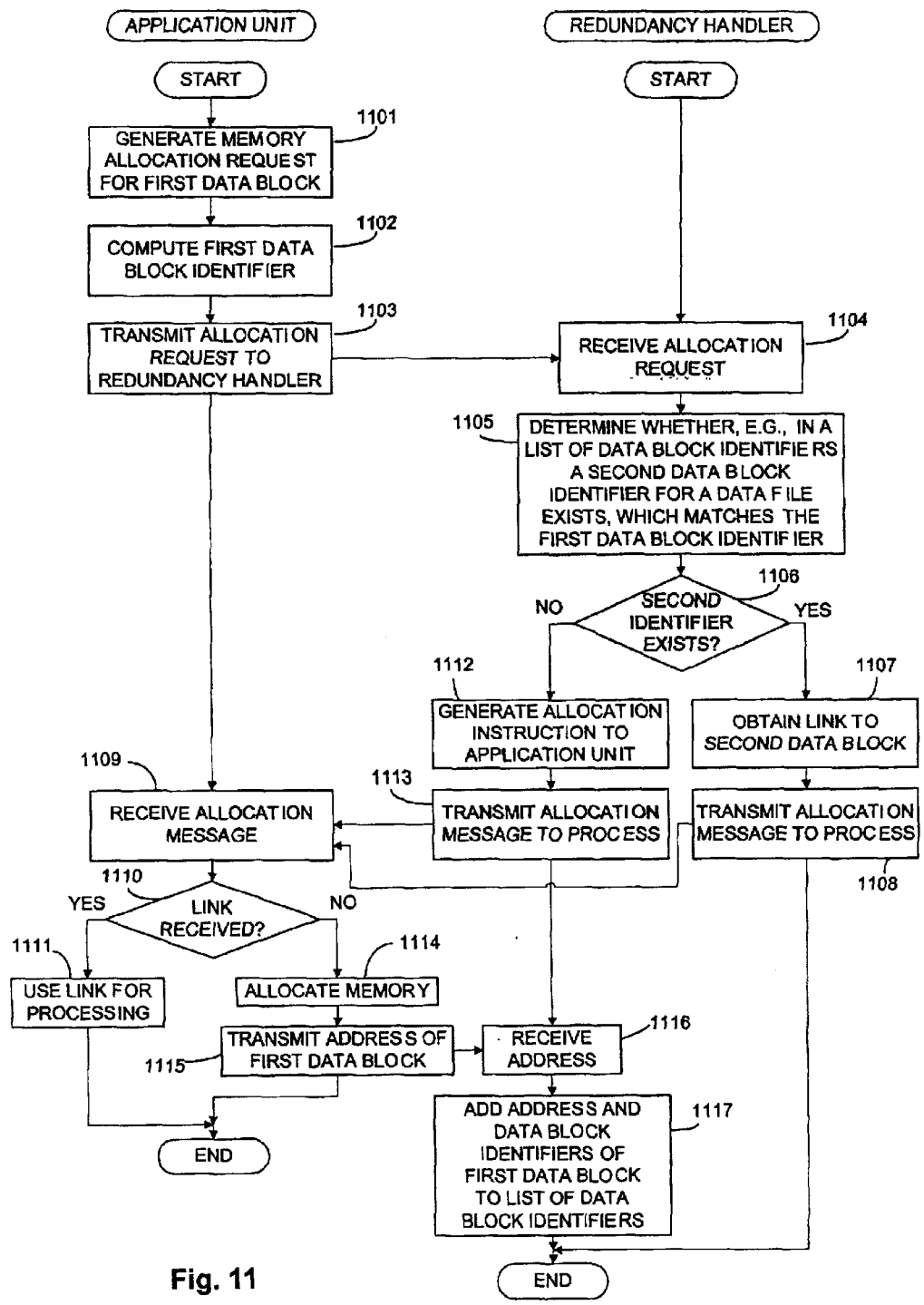
FIG. 11 depicts a flow diagram illustrating the steps for eliminating data redundancies in accordance with another embodiment consistent with the present invention.

Referring to FIG. 11, FIG. 11 depicts a flow diagram illustrating exemplary steps for eliminating data redundancies in accordance with methods, systems, and articles of manufacture consistent with the embodiment depicted in FIG. 10, however FIG. 11 is not limited thereto.

On the left-hand side of FIG. 11, operations carried out at an application unit are illustrated, and on the right-hand side of FIG. 11, operations at the redundancy handler are illustrated.

In FIG. 11, first, a memory allocation for a first data block is generated at the application unit, e.g., by a process running at a data processing unit of the application unit (step 1101). The allocation request may be generated during providing service to a user and may concern any type of data, as described above.

Then, the application unit calculates a first data block identifier, e.g., a checksum, for example as described above with reference to the above-described embodiments (step 1102).

Then, the application unit transmits the allocation request to the redundancy handler (step 1103). The allocation request at least identifies the first data block to be considered, and could also include the entire data block to be identified.

Then, the computer program of the redundancy handler receives the allocation request (step 1104). The transmission of the allocation request may be performed using any type of communication link, including for example internal connections, local area networks or wide area networks, dedicated communication links, or wireless transmissions. The identifier obtaining code piece may also computes the first data block identifier for the corresponding first data block, e.g., after receiving the first data block with the allocation request or retrieving the data block upon receiving an identifier of the first data block with the allocation request from the process. The identifier obtaining code piece may perform the data block identifier computation as described above with reference to the above-described embodiments.

Then, at the redundancy handler, the determining code piece determines whether a second data block identifier for a second data block exists which matches the first data block identifier (step 1105). This operation may be similar to what was outlined above with reference to above-described embodiments. For example, the determining code piece may look up the list of data block identifiers for making the determination. The determined results are evaluated in step 1106.

If the determining code piece determines that the second data block identifier exists in step 1106, and that consequently the data block subject of the allocation request is redundant, then the determining code piece of the redundancy handler determines a reference to a data block associated with the second data block identifier (step 1107). The reference may be a pointer to a memory partition, e.g., in memory 1008 of FIG. 10, storing data of the data block associated with the second data block identifier, i.e., data identical to the data of the data block subject of the allocation request.

Then, the determining code piece of the redundancy handler generates an allocation message for transmission to the application unit, at least including the reference (step 1108). The allocation message, if the data block is determined to be not redundant, may include an instruction to allocate corresponding storage space in the storage device. Further, if it is determined that the data block is redundant, the allocation message may include a reference to another storage location already storing the information of the first data block. The allocation message may be transmitted as described above with reference to steps 1103 and 1104. Transmission of the transmission message is indicated in FIG. 10 by arrow 1014 for first application unit 1000 and arrow 1016 for second application unit 1002.

Referring back to FIG. 11, then, at the application unit, the allocation message is received and analyzed to determine its content (step 1109).

Then, the application unit decides whether the analysis of step 1109 indicated that a reference was received (step 1110). If the application unit decides that a reference was received in step 1110, then the application unit uses the reference received with the allocation message for further processing, for example for accessing the corresponding data for following processing operations (step 1111). Since the reference preferably points to a memory location storing data identical to the data block subject of the allocation request, the application unit may readily continue normal processing.

Further, if the determining code piece determines in step 1106 that the second data block identifier does not exist, i.e., that the data block not redundant, then the determining code piece generates an allocation instruction for the application unit (step 1112). The allocation instruction at least includes information instructing the application unit or process to perform an allocation operation for the subject data block.

Then, the determining code piece transmits the allocation instruction to the application unit, e.g., similar to the transmission of the allocation request in steps 1103 and 1104 (step 1113).

The allocation message now includes the allocation instruction (as opposed to the reference of step 1108) and therefore, the decision in step 1110 will indicate that an allocation instruction was received at the application unit.

Consequently, the application unit proceeds to allocate memory space for the data block, for example in the storage device 1008 of FIG. 10 (step 1114).

Then, the application unit obtains an address of the memory partition for the data block allocated in step 1114 and transmits the address to the redundancy handler, in order to make the allocated memory space storing the data block available to other application units or processes (step 1115).

The address is received at the redundancy handler by the computer program (step 1116). Then, the redundancy code piece adds the address and the data block identifier of the first data block to the list of data block identifiers (step 1117).

Thus, the redundancy handler maintains an up-to-date list of identified data blocks, such that memory space is not allocated twice for the same data block.

In the above-described illustrative example, the identifier obtaining unit is located at the redundancy handler, however, in alternative embodiments the identifier obtaining unit may be located at the first application unit or the second application unit. In this case, the data block identifier for a data block to be identified is directly calculated at the respective application unit and the allocation request as transmitted from the first and second application units and to the redundancy handler may include the data block identifier computed at the respective application unit.

For example, referring to FIG. 10, if first application unit 1000 and second application unit 1002 are constituted by a server unit being in communication with a plurality of client units, the client units could individually launch service applications in order to establish respective communication sessions between the server unit and each client unit.

In a typical system, in this case identical memory allocations would be carried out for each communication session, thus requiring a potentially large data memory, such as random access memory or a hard disc. According to the present invention, multiple allocations for the same data blocks may be avoided, as each process first identifies the data block to be allocated for, i.e., if the data block is not already identified, the process proceeds to allocate storage space for the data block. If the data block is already identified, i.e., already available in the storage means, the redundancy handler 1004 returns a reference to the storage location storing the data block to the process, and thus the process may avoid allocating further storage space for the data block and instead use the reference for accessing the corresponding information of the data block.

It is noted that the redundancy handler may be connected to a plurality of application units, as described above, such that a plurality of application programs, processes, or application modules may access and utilize the same memory partitions storing respective data blocks needed for respective processing operations.

It is noted that the multi-level redundancy check particularly outlined with respect to FIGS. 8 and 9 may be used in combination with any of the other embodiments, such as the embodiments of FIGS. 10 and 11.

The foregoing description of an implementation of the invention has been presented for purposes of illustration and description. It is not exhaustive and does not limit the invention to the precise form disclosed. Modifications and variations are possible in light of the above teachings or may be acquired from practicing the invention. For example, the described implementation includes software but the present implementation may be implemented as a combination of hardware and software or hardware alone. The invention may be implemented with both object-oriented and non-object-oriented programming systems. The scope of the invention is defined by the claims and their equivalents.

What is claimed is:

1. A method for eliminating data redundancies in a data processing system, the method comprising the steps of:
    obtaining a first data block identifier for a first data block, the first data block identifier being calculated based on data of the first data block;
    determining whether a second data block identifier matching the first data block identifier exists, the second data block identifier being calculated based on data of a second data block; and
    when it is determined that the second data block identifier matching the first data block identifier exists,
        retrieving the second data block associated with the second data block identifier,
        determining whether the first data block and the retrieved second data block correspond to one another by obtaining a revised first data block identifier having more bits than the first data block identifier and by obtaining a revised second data block identifier having more bits than the second data block identifier, and
        replacing the first data block with a reference to the second data block when the first data block and the retrieved second data block correspond to one another.

2. The method of claim 1, further comprising the step of:
    adding the first data block identifier to a list of other data block identifiers when it is determined that the second data block identifier does not exist.

3. The method of claim 2, wherein the first data block identifier is added to the list of other data block identifiers with an address of the first data block.

4. The method of claim 1, further comprising the step of:
    when it is determined that the second data block identifier matching the first data block identifier exists, deleting the first data block.

5. The method of claim 1, further comprising the step of:
    when it is determined that the second data block identifier matching the first data block identifier exists, indicating that the first data block identifier is redundant.

6. The method of claim 1, further comprising the step of:
    when it is determined that the second data block identifier matching the first data block identifier does not exist, storing the first data block.

7. The method of claim 1, further comprising the step of:
    when it is determined that the second data block identifier matching the first data block identifier does not exist, transmitting the first data block to a client.

8. The method of claim 1, wherein the first and second data block identifiers comprise checksums.

9. The method of claim 1, wherein determining whether the first data block and the retrieved second data block correspond to one another comprises:
    comparing at least one of a plurality of bits of the first data block with at least one of a plurality of bits of the second data block.

10. The method of claim 1, wherein the step of determination whether the first data block and the second data block correspond to one another comprises comparing at least one of
    a data block name of the first and a data block name of the second data block,
    a date indicating a time of creation of the first data block and a date indicating a time of creation of the second data block, and
    a date indicating a time of alteration of the first data block and a date indicating a time of alteration of the second data block.

11. A method in a data processing system having data blocks with associated identifiers, the method comprising the steps of:
    receiving a request for a reference to a memory location that stores data, the request comprising the data;
    creating a new identifier that is based on the data;
    determining whether the new identifier is equivalent to one of the associated identifiers;
    when it is determined that the new identifier is equivalent to one of the associated identifiers,
        retrieving the data block associated with the one associated identifier,
        determining whether the data in the request and the retrieved data block correspond to one another by obtaining a revised new identifier having more bits than the new identifier and by obtaining a revised one associated identifier having more bits than the one associated identifier, and
        returning a reference to the data block that is associated with the one associated identifier when the data in the request and the retrieved data block correspond to one another.

12. The method of claim 11 further comprising the steps of:
    when it is determined that the new identifier is not equivalent to one of the associated identifiers,
    allocating memory for the data;
    storing the data in the allocated memory; and
    returning a reference to the allocated memory.

13. A method for avoiding data redundancies in a data processing system, the method comprising the steps of:
    obtaining a first data block identifier for a first data block, the first data block identifier being calculated based on data of the first data block;

generating a memory allocation request for the first data block;

transmitting the memory allocation request to a redundancy handler, the memory allocation request instructing the redundancy handler to determine whether a second data block identifier matching the first data block identifier exists, wherein the second data block identifier is calculated based on data of a second data block; and receiving an allocation response indicating whether the second data block identifier of the second data block exists, the allocation response including a reference to the second data block when the second data block identifier exists, wherein when the redundancy handler determines that the second data block identifier matching the first data block identifier exists, the redundancy handler:

retrieves the second data block associated with the second data block identifier, and determines whether the first data block and the retrieved second data block correspond to one another by obtaining a revised first data block identifier having more bits than the first data block identifier and by obtaining a revised second data block identifier having more bits than the second data block identifier.

14. The method of claim 13, wherein the memory allocation request includes at least one of an address of the first data block and the first data block identifier; and wherein the data processing unit uses the reference to the second data block to access the second data block.

15. The method of claim 13, wherein the allocation response includes an allocation instruction to allocate storage space for the first data block when the second data block identifier does not exist and to transmit an address of the allocated storage space to the redundancy handler for instructing the redundancy handler to store the address of the first data block in association with the first data block identifier in a list of data block identifiers.

16. The method o claim 13, wherein the first and second data block identifiers comprise checksums.

17. A The method of claim 13, wherein determining whether the first data block and the retrieved second data block correspond to one another comprises:

comparing at least one of a plurality of bits of the first data block with at least one of a plurality of bits of the second data block.

18. The method of claim 13, wherein the step of determination whether the first data block and the second data block correspond to one another comprises comparing at least one of a data block name of the first and a data block name of the second data block, a date indicating a time of creation of the first data block and a date indicating a time of creation of the second data block, and a date indicating a time of alteration of the first data block and a date indicating a time of alteration of the second data block.

19. A method for eliminating data redundancies in a data processing system, the method comprising the steps of:

receiving a first data block;

calculating a first data block identifier based on data of the first data block;

determining whether a second data block identifier matching the first data block identifier exists in a list of other data block identifiers, the second data block identifier being calculated based on data of a second data block;

when it is determined that the second data block identifier matching the first data block identifier exists, retrieving the second data block associated with the second data block identifier, determining whether the first data block and the retrieved second data block correspond to one another by obtaining a revised first data block identifier having more bits than the first data block identifier and by obtaining a revised second data block identifier having more bits than the second data block identifier, and replacing the first data block with a reference to the second data block when the first data block and the retrieved second data block correspond to one another; and when it is determined that the second data block identifier matching the first data block identifier does not exist, adding the first data block identifier to the list.

20. A computer-readable medium containing instructions that cause a data processing system to perform a method comprising the steps of:

obtaining a first data block identifier for a first data block, the first data block identifier being calculated based on data of the first data block;

determining whether a second data block identifier matching the first data block identifier exists, the second data block identifier being calculated based on data of a second data block; and when it is determined that the second data block identifier matching the first data block identifier exists, retrieving the second data block associated with the second data block identifier, determining whether the first data block and the retrieved second data block correspond to one another by obtaining a revised first data block identifier having more bits than the first data block identifier and by obtaining a revised second data block identifier having more bits than the second data block identifier, and replacing the first data block with a reference to the second data block when the first data block and the retrieved second data block correspond to one another.

21. The computer-readable medium of claim 20, further comprising the step of:

adding the first data block identifier to a list of other data block identifiers when it is determined that the second data block identifier does not exist.

22. The computer-readable medium of claim 21, wherein the first data block identifier is added to the list of other data block identifiers with an address of the first data block.

23. The computer-readable medium of claim 20 further comprising the step of:

when it is determined that the second data block identifier matching the first data block identifier exists, deleting the first data block.

24. The computer-readable medium of claim 20, further comprising the step of:

when it is determined that the second data block identifier matching the first data block identifier exists, indicating that the first data block identifier is redundant.

25. The computer-readable medium of claim 20, further comprising the step of:

when it is determined that the second data block identifier matching the first data block identifier does not exist, storing the first data block.

26. The computer-readable medium of claim 20, further comprising the step of:
when it is determined that the second data block identifier matching the first data block identifier does not exist, transmitting the first data block to a client.

27. The computer-readable medium of claim 20, wherein the first and second data block identifiers comprise checksums.

28. The computer-readable medium of claim 20, wherein determining whether the first data block and the retrieved second data block correspond to one another comprises:
comparing at least one of a plurality of bits of the first data block with at least one of a plurality of bits of the second data block.

29. The computer-readable medium of claim 20, wherein the step of determination whether the first data block and the second data block correspond to one another comprises comparing at least one of
a data block name of the first and a data block name of the second data block,
a date indicating a time of creation of the first data block and a date indicating a time of creation of the second data block, and
a date indicating a time of alteration of the first data block and a date indicating a time of alteration of the second data block.

30. A computer-readable medium containing instructions that cause a data processing system having blocks associated with identifiers to perform a method comprising the steps of:
receiving a request for a reference to a memory location that stores data, the request comprising the data;
creating a new identifier that is based on the data;
determining whether the new identifier is equivalent to one of the associated identifiers;
when it is determined that the new identifier is equivalent to one of the associated identifiers,
retrieving the second data block associated with the second data block identifier, and
determining whether the first data block and the retrieved second data block correspond to one another by obtaining a revised first data block identifier having more bits than the first data block identifier and by obtaining a revised second data block identifier having more bits than the second data block identifier
returning a reference to the data block that is associated with the one associated identifier.

31. The computer-readable medium of claims 30 further comprising the steps of:
when it is determined that the new identifier is not equivalent to one of the associated identifiers,
allocating memory for the data;
storing the data in the allocated memory; and
returning a reference to the allocated memory.

32. A computer-readable medium containing instructions that cause a data processing system to perform a method comprising the steps of:
obtaining a first data block identifier for a first data block, the first data block identifier being calculated based on data of the first data block;
generating a memory allocation request for the first data block;
transmitting the memory allocation request to a redundancy handler, the memory allocation request instructing the redundancy handler to determine whether a second data block identifier matching the first data block identifier exists, wherein the second data block identifier is calculated based on data of a second data block; and
receiving an allocation response indicating whether the second data block identifier of the second data block exists, the allocation response including a reference to the second data block when the second data block identifier exists,
wherein when the redundancy handler determines that the second data block identifier matching the first data block identifier exists, the redundancy handler:
retrieves the second data block associated with the second data block identifier, and
determines whether the first data block and the retrieved second data block correspond to one another by obtaining a revised first data block identifier having more bits than the first data block identifier and by obtaining a revised second data block identifier having more bits than the second data block identifier.

33. The computer-readable medium of claim 32, wherein the memory allocation request includes at least one of an address of the first data block and the first data block identifier; and wherein the data processing unit uses the reference to the second data block to access the second data block.

34. The computer-readable medium of claim 32, wherein the allocation response includes an allocation instruction to allocate storage space for the first data block when the second data block identifier does not exist and to transmit an address of the allocated storage space to the redundancy handler for instructing the redundancy handler to store the address of the first data block in association with the first data block identifier in a list of data block identifiers.

35. The computer-readable medium of claims 32, wherein the first and second data block identifiers comprise checksums.

36. The computer-readable medium of claim 32, wherein determining whether the first data block and the retrieved second data block correspond to one another comprises:
comparing at least one of a plurality of bits of the first data block with at least one of a plurality of bits of the second data block.

37. The computer-readable medium of claim 32, wherein the step of determination whether the first data block and the second data block correspond to one another comprises comparing at least one of
a data block name of the first and a data block name of the second data block,
a date indicating a time of creation of the first data block and a date indicating a time of creation of the second data block, and
a date indicating a time of alteration of the first data block and a date indicating a time of alteration of the second data block.

38. A computer-readable medium containing instructions that cause a data processing system to perform a method comprising the steps of:
receiving a first data block;
calculating a first data block identifier based on data of the first data block;
determining whether a second data block identifier matching the first data block identifier exists in a list of other data block identifiers, the second data block identifier being calculated based on data of a second data block;

when it is determined that the second data block identifier matching the first data block identifier exists,
retrieving the second data block associated with the second data block identifier,
determining whether the first data block and the retrieved second data block correspond to one another by obtaining a revised first data block identifier having more bits than the first data block identifier and by obtaining a revised second data block identifier having more bits than the second data block identifier, and
replacing the first data block with a reference to the second data block when the first data block and the retrieved second data block correspond to one another; and
when it is determined that the second data block identifier matching the first data block identifier does not exist, adding the first data block identifier to the list.

39. A data processing system comprising:
a secondary storage device having a stored data block with data;
a memory comprising a computer program that obtains a first data block identifier for a first data block, the first data block identifier being calculated based on data of the first data block, determines whether a second data block identifier matching the first data block identifier exists, the second data block identifier being calculated based on data of a second data block, and when it is determined that the second data block identifier matching the first data block identifier exists,
retrieves the second data block associated with the second data block identifier,
determines whether the first data block and the retrieved second data block correspond to one another by obtaining a revised first data block identifier having more bits than the first data block identifier and by obtaining a revised second data block identifier having more bits than the second data block identifier, and
replaces the first data block with a reference to the second data block; and
a processing unit that runs the computer program.

40. A data processing system comprising:
a secondary storage device having a stored data block with data;
a memory comprising a computer program that receives a request for a reference to a memory location that stores data, the request comprising the data, creates a new identifier that is based on the data, determines whether the new identifier is equivalent to one of the associated identifiers, and when it is determined that the new identifier is equivalent to one of the associated identifiers,
retrieves the data block associated with the one associated identifier,
determines whether the data in the request and the retrieved data block correspond to one another by obtaining a revised new identifier having more bits than the new identifier and by obtaining a revised one associated identifier having more bits than the one associated identifier, and
returns a reference to the data block that is associated with the one associated identifier; and
a processing unit that runs the computer program.

41. A data processing system comprising:
a secondary storage device having a stored data block with data;
a memory comprising a computer program that obtains a first data block identifier for a first data block, the first data block identifier being calculated based on data of the first data block, generates a memory allocation request for the first data block, transmits the memory allocation request to a redundancy handler, the memory allocation request instructing the redundancy handler to determine whether a second data block identifier matching the first data block identifier exists, wherein the second data block identifier is calculated based on data of a second data block, and receives an allocation response indicating whether the second data block identifier of the second data block exists, the allocation response including a reference to the second data block when the second data block identifier exists; and
a processing unit that runs the computer program,
wherein when the redundancy handler determines that the second data block identifier matching the first data block identifier exists, the redundancy handler:
retrieves the second data block associated with the second data block identifier, and
determines whether the first data block and the retrieved second data block correspond to one another by obtaining a revised first data block identifier having more bits than the first data block identifier and by obtaining a revised second data block identifier having more bits than the second data block identifier.

42. A data processing system for eliminating data redundancies, the data processing system comprising:
means for obtaining a first data block identifier for a first data block, the first data block identifier being calculated based on data of the first data block;
means for determining whether a second data block identifier matching the first data block identifier exists, the second data block identifier being calculated based on data of a second data block; and
means for, when it is determined that the second data block identifier matching the first data block identifier exists,
retrieving the second data block associated with the second data block identifier,
determining whether the first data block and the retrieved second data block correspond to one another by obtaining a revised first data block identifier having more bits than the first data block identifier and by obtaining a revised second data block identifier having more bits than the second data block identifier, and
replacing the first data block with a reference to the second data block.

43. A data processing system for eliminating data redundancies, the data processing system having data blocks with associated identifiers, the data processing system comprising:
means for receiving a request for a reference to a memory location that stores data, the request comprising the data;
means for creating a new identifier that is based on the data;
means for determining whether the new identifier is equivalent to one of the associated identifiers;
means for, when it is determined that the new identifier is equivalent to one of the associated identifiers,
retrieving the data block associated with the one associated identifier, determining whether the data in the request and the retrieved data block correspond to one another by obtaining a revised new identifier having more bits than the new identifier and by obtaining a revised one associated identifier having more bits than the one associated identifier, and returning a reference to the data block that is associated with the one associated identifier when the data in the request and the retrieved data block correspond to one another.

44. A data processing system for eliminating data redundancies, the data processing system comprising:

means for obtaining a first data block identifier for a first data block, the first data block identifier being calculated based on data of the first data block;

means for generating a memory allocation request for the first data block;

means for transmitting the memory allocation request to a redundancy handler, the memory allocation request instructing the redundancy handler to determine whether a second data block identifier matching the first data block identifier exists, wherein the second data block identifier is calculated based on data of a second data block; and means for receiving an allocation response indicating whether the second data block identifier of the second data block exists, the allocation response including a reference to the second data block when the second data block identifier exists, wherein when the redundancy handler determines that the second data block identifier matching the first data block identifier exists, the redundancy handler:

retrieves the second data block associated with the second data block identifier, and determines whether the first data block and the retrieved second data block correspond to one another by obtaining a revised first data block identifier having more bits than the first data block identifier and by obtaining a revised second data block identifier having more bits than the second data block identifier.

45. A data processing system for eliminating data redundancies, the data processing system comprising:

means for receiving a first data block;

means for calculating a first data block identifier based on data of the first data block;

means for determining whether a second data block identifier matching the first data block identifier exists in a list of other data block identifiers, the second data block identifier being calculated based on data of a second data block;

means for, when it is determined that the second data block identifier matching the first data block identifier exists, retrieving the second data block associated with the second data block identifier, determining whether the first data block and the retrieved second data block correspond to one another by obtaining a revised first data block identifier having more bits than the first data block identifier and by obtaining a revised second data block identifier having more bits than the second data block identifier, and replacing the first data block with a reference to the second data block when the first data block and the retrieved second data block correspond to one another; and means for, when it is determined that the second data block identifier matching the first data block identifier does not exist, adding the first data block identifier to the list.

46. A computer-readable memory device encoded with a data structure and a program that accesses the data structure, the program is run by a processor in a data processing system, the data structure having a plurality of entries, each entry comprising:

a reference to a data block that contains data and an identifier that is based on the data using a calculation, wherein when the program receives a request to create a new data block containing new data, the program creates a new identifier based on the new data using the calculation, compares the new identifier to the identifiers in the entries to prevent a data block redundancy, and when the new identifier matches one of the identifiers:

retrieves the data block associated with the one identifier, determines whether the new data block and the retrieved data block correspond to one another by obtaining a revised new identifier having more bits than the new identifier and by obtaining a revised one identifier having more bits than the one identifier, and replaces the new data block with a reference to an existing data block corresponding to the identifier when the new data block and the retrieved data block correspond to one another.

* * * * *

UNITED STATES PATENT AND TRADEMARK OFFICE
CERTIFICATE OF CORRECTION

PATENT NO. : 6,889,297 B2
DATED : May 3, 2005
INVENTOR(S) : Oliver Krapp, Thorsten Laux and Joerg Heilig It is certified that error appears in the above-identified patent and that said Letters Patent is hereby corrected as shown below:

Column 23,
Line 40, delete "o" and insert -- of --.
Line 42, delete "A".

Column 24,
Line 53, insert -- , -- after "20".

Column 25,
Line 50, delete "claims" and insert -- claim --.

Column 26,
Line 36, delete "claims" and insert -- claim --.

Signed and Sealed this

Fourth Day of April, 2006

JON W. DUDAS
*Director of the United States Patent and Trademark Office*